(12) United States Patent
Naruoka

(10) Patent No.: US 6,673,640 B2
(45) Date of Patent: Jan. 6, 2004

(54) METHOD OF MANUFACTURING SEMICONDUCTOR DEVICE FOR EVALUATION CAPABLE OF EVALUATING CRYSTAL DEFECT USING IN-LINE TEST BY AVOIDING USING PREFERENTIAL ETCHING PROCESS

(75) Inventor: Hideki Naruoka, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/191,320

(22) Filed: Jul. 10, 2002

(65) Prior Publication Data

US 2003/0113941 A1 Jun. 19, 2003

(30) Foreign Application Priority Data

Dec. 19, 2001 (JP) ........................................ 2001-386208

(51) Int. Cl.[7] .............................................. H01L 31/26
(52) U.S. Cl. ...................... 438/14; 438/143; 438/150; 438/149; 438/160; 438/16; 438/17; 356/600; 356/237.2; 250/458.1
(58) Field of Search .......................... 438/14, 143, 150, 438/149, 160, 16, 17; 356/237.2, 600, 237.1; 250/458.1

(56) References Cited

U.S. PATENT DOCUMENTS 5,244,819 A * 9/1993 Yue .............................. 438/402

6,001,711 A * 12/1999 Hashimoto ..................... 438/473

FOREIGN PATENT DOCUMENTS

| JP | 59-158532 | 9/1984 |
| JP | 11-274257 | 10/1999 |

OTHER PUBLICATIONS

S. M. Sze. Physics Of Semiconductor Devices, 1981, John Wiley & Sons, 2 Edition, P158.*

* cited by examiner

Primary Examiner—Matthew Smith
Assistant Examiner—Belur V Keshavan
(74) Attorney, Agent, or Firm—Oblon, Spivak, McClelland, Maier & Neustadt, P.C.

(57) ABSTRACT

In order to obtain a method of evaluating a crystal defect which allows crystal defects generated in a thin film SOI layer or a thin film surface layer to be evaluated using an in-line test, an SOI layer 3 has silicide regions 8 formed in the evaluation region consequently upon generation of crystal defects generated in the SOI layer 3. The silicide regions 8 are regions silicided as a result of the crystal defects having gettered metals which are contained in a transition layer 10 and diffuse into the SOI layer 3 upon a heat treatment. A laser beam is irradiated to the evaluation region via the transition layer 10 and the silicon oxide film 6. By monitoring a current flowing between first and second probes using an ampere meter while scanning the evaluation region with a laser beam, it is possible to evaluate the crystal defects in the evaluation region.

11 Claims, 19 Drawing Sheets

F I G. 25
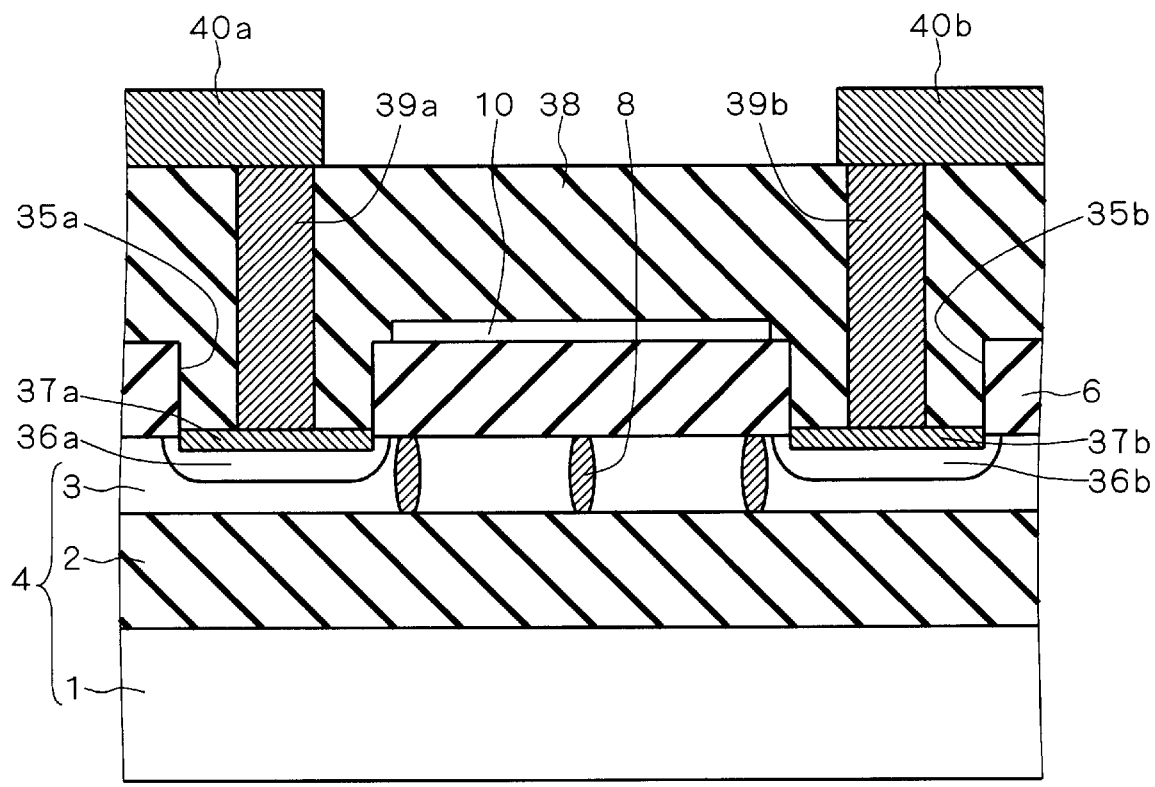
F I G. 26
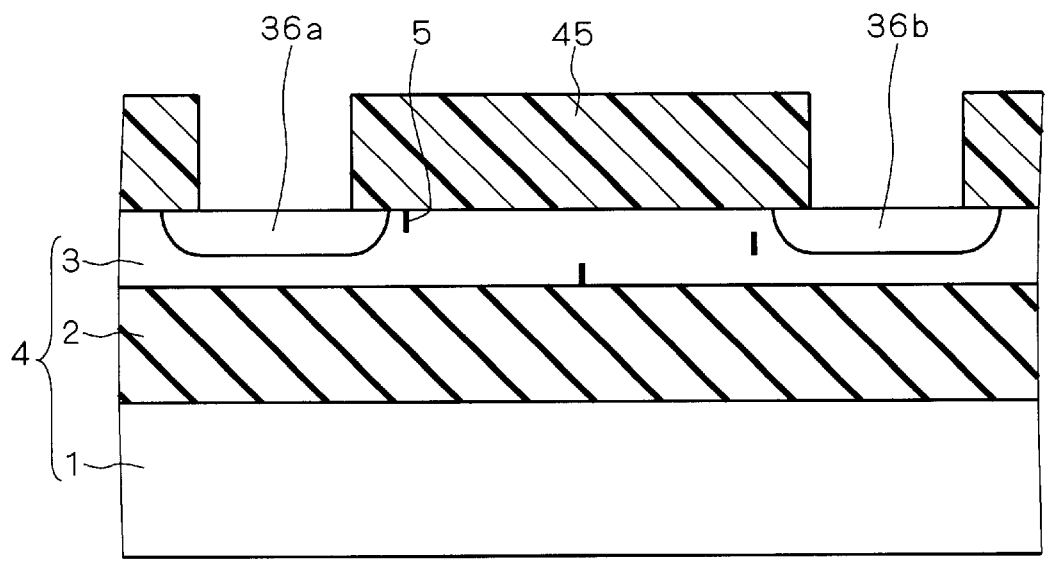

F I G. 29
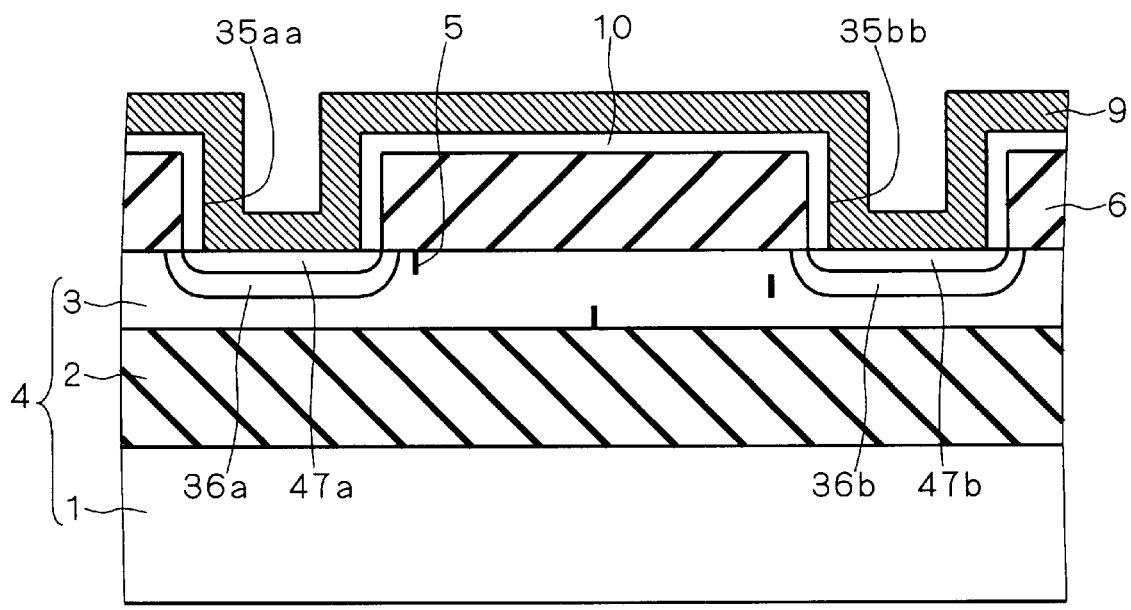
F I G. 30
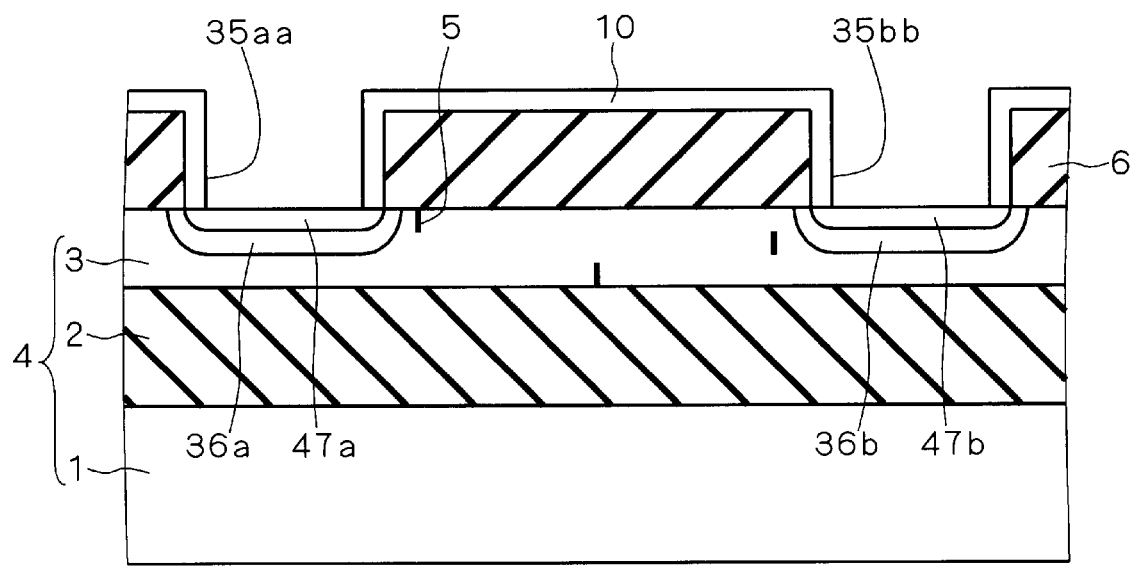

METHOD OF MANUFACTURING SEMICONDUCTOR DEVICE FOR EVALUATION CAPABLE OF EVALUATING CRYSTAL DEFECT USING IN-LINE TEST BY AVOIDING USING PREFERENTIAL ETCHING PROCESS

BACKGROUND OF THE INVENTION

1. Field of the Invention

The present invention relates to a method of detecting a crystal defect, a method of manufacturing a semiconductor device for evaluation, a method of evaluating a crystal defect and a semiconductor device for evaluation, which are used to evaluate a crystal defect generated within a semiconductor layer.

2. Description of the Background Art

Crystal defects which are likely to occur during manufacture of a semiconductor substrate, or are induced in a semiconductor substrate due to a manufacturing process for a semiconductor device, cause degradation of various device characteristics such as junction characteristics (i.e., increase in junction leakage), on one hand. On the other hand, however, crystal defects, provided that the density or location thereof is controlled, are utilized as gettering sites for removing metals contained in a region where a device is to be formed. For this reason, quantitative evaluation of crystal defects generated within a semiconductor substrate has been conventionally conducted.

As a method of evaluating a crystal defect occurring during manufacture of a semiconductor substrate, a method using a preferential etching process is well known. According to this method, first, crystal defects are detected such that the crystal defects appear in units of microns by performing a preferential etching process using a predetermined etchant. Thereafter, observation of the detected crystal defects is carried out with an optical microscope or a scanning electron microscope, to simply count the crystal defects. For the predetermined etchant, an etchant containing chromium such as Wright etch solution (a liquid mixture of HF, $HNO_3$, $CrO_3$, $Cu(NO_3)$, $CH_3COOH$ and $H_2O$), Secco etch solution (a liquid mixture of HF and $K_2Cr_2O_7$), and Sirtl etch solution (a liquid mixture of HF, $CrO_3$ and $H_2O$), or an etchant not containing chromium such as a liquid mixture of HF and $HNO_3$, has been employed.

Semiconductor devices recently employed to practice includes a semiconductor device with an SOI substrate having a structure in which a thin film SOI layer with a film thickness of 100 nm or smaller is formed on a buried oxide layer, and a semiconductor device with a substrate having a structure in which a thin film surface layer (Si layer or SiGe layer) with a film thickness of 100 nm or smaller is formed on a silicon substrate. In evaluating crystal defects generated within the substrates having the aforementioned structures, use of the conventional evaluation method which entails a preferential etching process has caused some problems. For example, it is probable that the thin film SOI layer or the thin film surface layer disappears due to the etching process. Further, microroughness is liable to be caused in a surface of the thin film SOI layer, an interface between the thin film SOI layer and the buried oxide layer, a surface of the thin film surface layer, or an interface between the thin film surface layer and the silicon substrate, which would make it difficult to detect the crystal defects.

The conventional evaluation method has a further disadvantage as follows. That is, the conventional method includes a preferential etching process by which also a wafer is unavoidably etched in detecting crystal defects. Accordingly, the wafer can no longer serve as a product wafer after that. For this reason, the conventional method requires an off-line test which is carried out by picking up a sample wafer for evaluation from a lot of wafers to accomplish evaluation. In other words, according to the conventional method, an in-line test which is performed using a product wafer without removing it from a manufacturing line is impossible.

SUMMARY OF THE INVENTION

The present invention addresses the foregoing problems. It is therefore an object of the present invention to obtain a method of detecting a crystal defect, a method of manufacturing a semiconductor device for evaluation, a method of evaluating a crystal defect, and a semiconductor device for evaluation, which allow a crystal defect occurring within a thin film SOI layer or a thin film surface layer to be evaluated using an in-line test while avoiding using a preferential etching process.

According to the present invention, the method of manufacturing a semiconductor device for evaluation includes the steps (a) to (d). The step (a) is to prepare a substrate having a semiconductor layer which contains a crystal defect to be evaluated. The step (b) is to form an insulating film on at least an evaluation region of the semiconductor layer. The step (c) is to form a metal-containing film containing a metal on the insulating film. The step (d) is to cause the metal contained in the metal-containing film to pass through the insulating film and diffuse into the semiconductor layer by carrying out a heat treatment, to detect the crystal defect.

The metal diffusing in the semiconductor layer in the step (d) is gettered by the crystal defect in the semiconductor layer. As a result, a metal-semiconductor compound is formed in a portion where the crystal defect has existed, thereby to detect the crystal defect. Accordingly, it is possible to obtain a semiconductor device for evaluation of which crystal defect in the semiconductor layer is satisfactorily detected.

This and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a sectional view showing a structure of a second semiconductor device for evaluation according to the sixth preferred embodiment of the present invention.

FIGS. 26 through 31 are sectional views for illustrating a method of manufacturing the first semiconductor device for evaluation shown in FIG. 24.

DESCRIPTION OF THE PREFERRED EMBODIMENTS

Preferred Embodiments

<First Preferred Embodiment>

Figure 1:
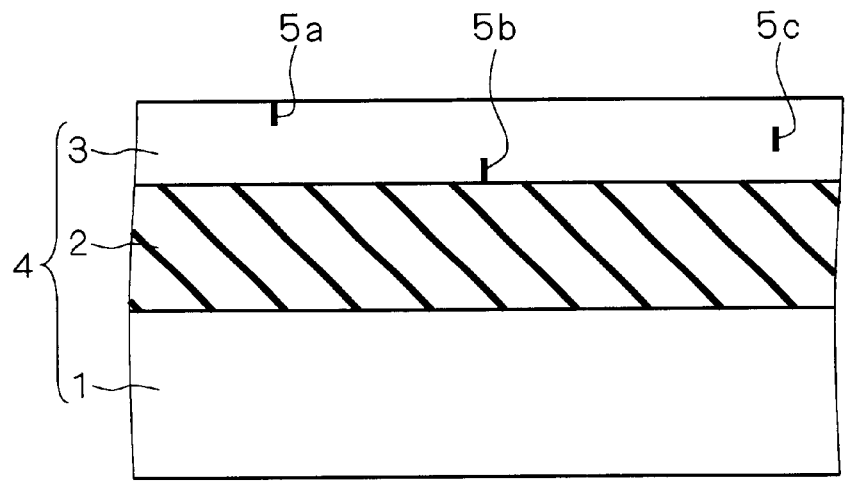
FIGS. 1 through 5 are sectional views for illustrating a method of evaluating a crystal defect according to a first preferred embodiment of the present invention in order of occurrence of respective steps.

FIGS. 1 to 5 are sectional views of structures in the course of respective steps included in a method of evaluating a crystal defect according to a first preferred embodiment, for illustrating the method in order of occurrence of the respective steps. Referring to FIG. 1, first, an SOI substrate 4 which has a support substrate 1 of silicon, a buried oxide layer 2 made of a silicon oxide film and an 801 layer 3 of silicon which are stacked in this order is prepared. For the SOI layer 3, a thin film SOI layer having a film thickness of 100 nm or smaller can be employed. The SOI layer 3 contains crystal defects 5a to 5c generated during manufacture of the SOI substrate 4. The SOI layer 3 is a film to which evaluation of crystal defects is directed. Additionally, for the SOI substrate 4, a substrate having a structure in which a thin film surface layer (Si layer or a SiGe layer) with a film thickness of 100 nm or smaller is formed on a silicon substrate may alternatively be employed. In such a case, the thin film surface layer is a film to which evaluation of crystal defects is directed.

Figure 2:
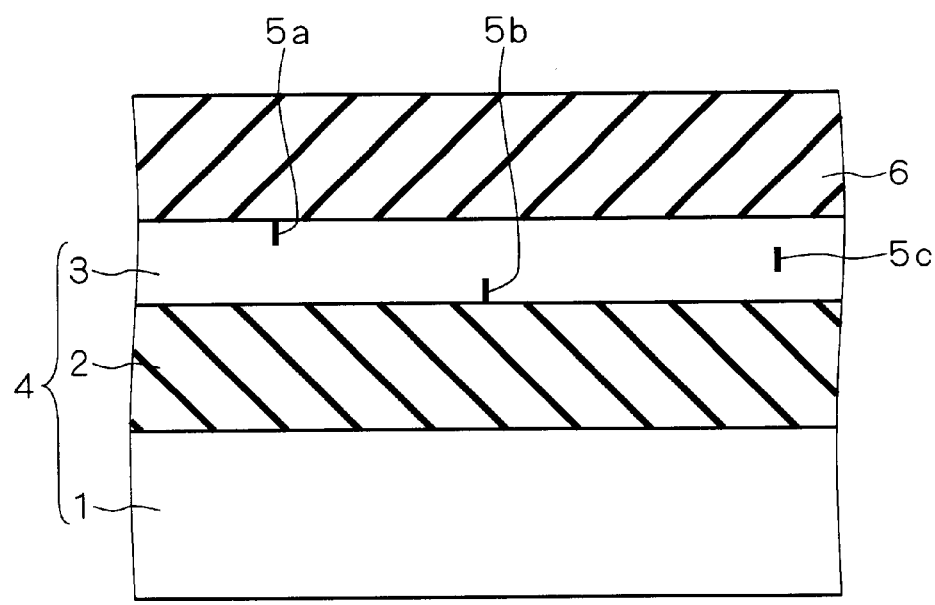

Referring to FIG. 2, next, a silicon oxide film 6 is formed on a top face of the SOI layer 3 by a thermal CVD process or a plasma CVD process. The thickness of the silicon oxide film 6 is set to a thickness which allows metals (metal atoms or metal ions) contained in a metal film 7, which will be described later, to pass through the silicon oxide film 6 so that thermal diffusion of the metals can occur within the SOI layer 3. For example, the thickness of the silicon oxide film 6 is set to between 10 nm and 300 nm, inclusive.

Figure 3:
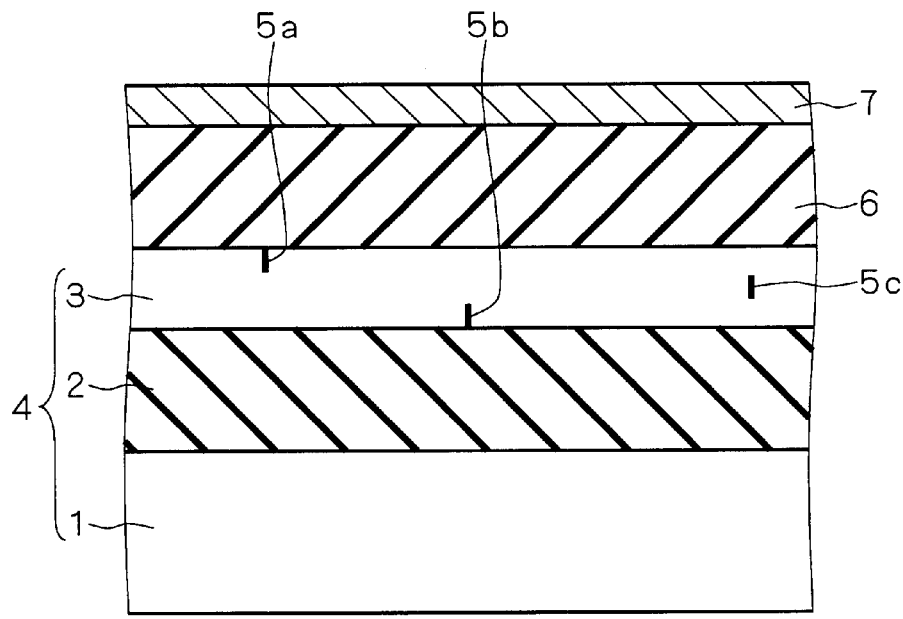

Referring to FIG. 3, next, the metal film 7 is formed on a top face of the silicon oxide film 6. More specifically, a solution containing metal ions such as Mo, Ni, Ti and Co is applied to the top face of the silicon oxide film 6, and then the solution is dried to be hardened, thereby to form the metal film 7. The solution can be obtained by diluting a standard reagent typically used for atomic absorption analysis with pure water or a solvent such as isopropyl alcohol. Further, by adjusting the amount of the solvent to be used, it is possible to arbitrarily control the concentration of the metal ions contained in the solution applied to the silicon oxide film 6. Additionally, the technique explained above in which a solution containing metals is applied to a silicon wafer and is dried to be hardened is widely used for purposely contaminating a silicon wafer.

Figure 4:
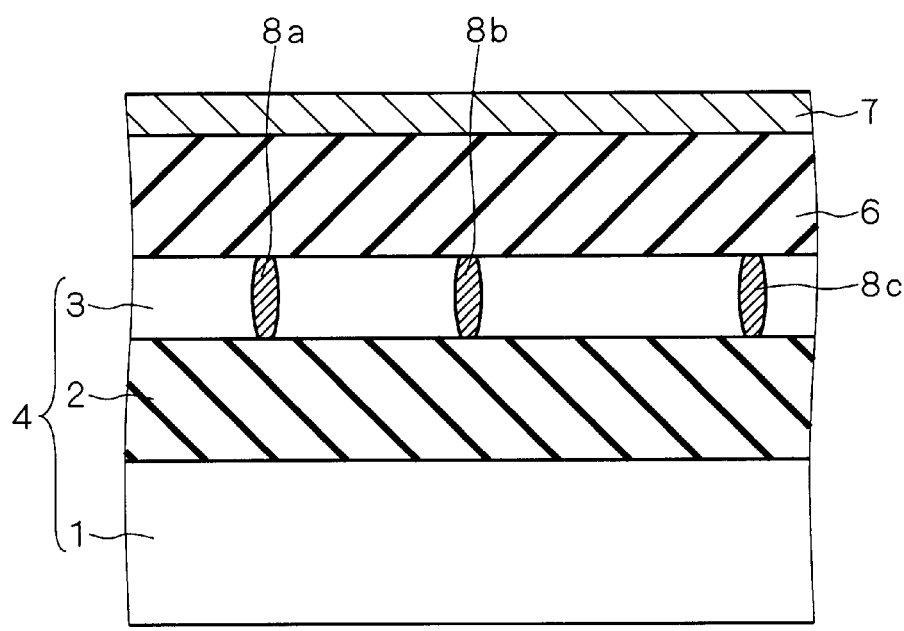

Referring to FIG. 4, next, a heat treatment is carried out in an atmosphere of argon or nitrogen at a temperature in a range of approximately 700 to 1000° C. for 10 seconds or more by using a Rapid Thermal Annealing (RTA) technique. This treatment causes the metals contained in the metal film 7 to pass through the silicon oxide film 6 and diffuse into the SOI layer 3. The metals diffusing within the SOI layer 3 are gettered by the crystal defects 5a to 5c in the SOI layer 3, so that silicidation reaction between the metals and the silicon of the SOI layer 3 proceeds. The silicidation reaction proceeds with a predetermined orientation. FIG. 4 illustrates a structure obtained in an instance where the silicidation reaction proceeds along the depth direction of the SOI layer 3, for example. As a result of the silicidation reaction, silicide regions 8a to 8c which are regions silicided are formed in portions where the crystal defects 5a to 5c have existed, respectively. In the instance illustrated in FIG. 4, the silicide regions 8a to 8c are formed so as to extend from the top face of the SOI layer 3 to a top face of the buried oxide layer 2. By performing the foregoing steps, the crystal defects 5a to 5c generated within the SOI layer 3 are detected. As such, FIGS. 1 to 4 illustrate a method of detecting a crystal defect according to the first preferred embodiment.

Figure 5:
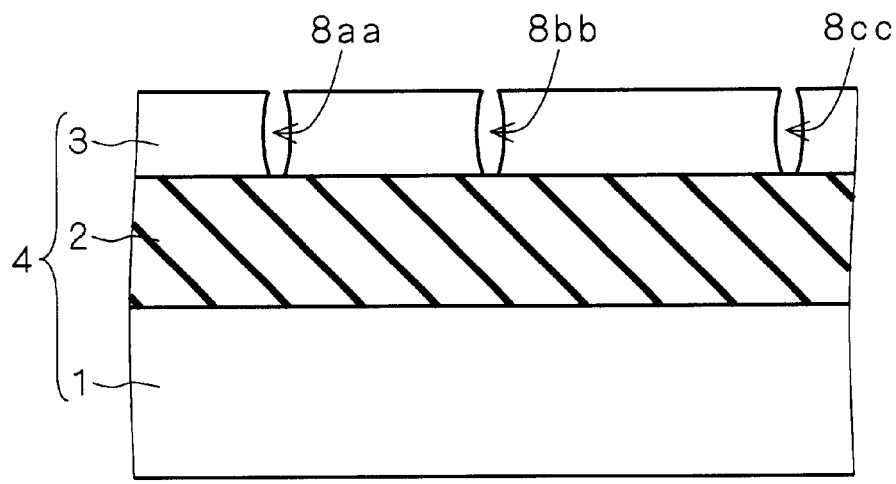

Referring to FIG. 5, then, the structure obtained by the foregoing steps is immersed in an HF solution for 1 minute or more. As a result, the metal film 7, the silicon oxide film 6 and the silicide regions 8a to 8c are subjected to a wet etching process and removed. Consequently, cavities 8aa to 8cc are formed in portions where the silicide regions 8a to 8c have existed, respectively, in the SOI layer 3. At that time, the wet etching process may also remove portions of the top face of the buried oxide layer 2 located under the silicide regions 8a to 8c. By performing the foregoing steps, a semiconductor device for evaluation is manufactured. As such, FIGS. 1 to 5 illustrate a method of manufacturing a semiconductor device for evaluation according to the first preferred embodiment. Additionally, there can be an alternative interpretation that the crystal defects 5a to 5c are detected by formation of the cavities 8aa to 8cc.

Then, observation of the structure shown in FIG. 5 is-carried out from above the top face of the SOI layer 3 with an optical microscope or a scanning electron microscope, thereby to implement quantitative evaluation of the crystal defects generated in the SOI layer 3.

As described above, the method of evaluating a crystal defect according to the first preferred embodiment, unlike the conventional method, does not require a preferential etching process to detect crystal defects. Instead, the crystal defects 5a to 5c are detected by formation of the silicide regions 8a to 8c. Therefore, it is possible to detect crystal defects without being affected by microroughness possibly caused in the top face of the SOI layer 3 or the interface between a bottom face of the SOI layer 3 and the top face of the buried oxide layer 2. This makes it possible to accurately evaluate the density of crystal defects generated within the SOI layer 3 during manufacture of the SOI substrate 4.

Further, the metal film 7 functioning as a source of metals supplied to the SOI layer 3 is formed not directly on the SOI layer 3, but on the silicon oxide film 6 which is formed on the SOI layer 3. If the metal film 7 is formed directly on the SOI layer 3, it would result in formation of a silicide layer in an interface between the metal film 7 and the SOI layer 3 because of the heat treatment. Such a silicide layer is difficult to distinguish from the silicide regions 8a to 8c caused due to crystal defects, and thus, accurate evaluation of crystal defects would be impossible, especially when the evaluation of crystal defects is directed to the thin film SOI layer or the thin film surface layer. However, the method of evaluating a crystal defect according to the first preferred embodiment, in which the metal film 7 is formed on the silicon oxide film 6 functioning as an anti to reaction film, prevents occurrence of the above-noted situation. Moreover, the method of evaluating a crystal defect according to the first preferred embodiment produces a further advantage of avoiding generation of any additional defect which is most likely to occur in the top face of the SOI layer 3 if the metal film 7 is formed directly on the SOI layer 3.

<Second Preferred Embodiment>

Figure 6:
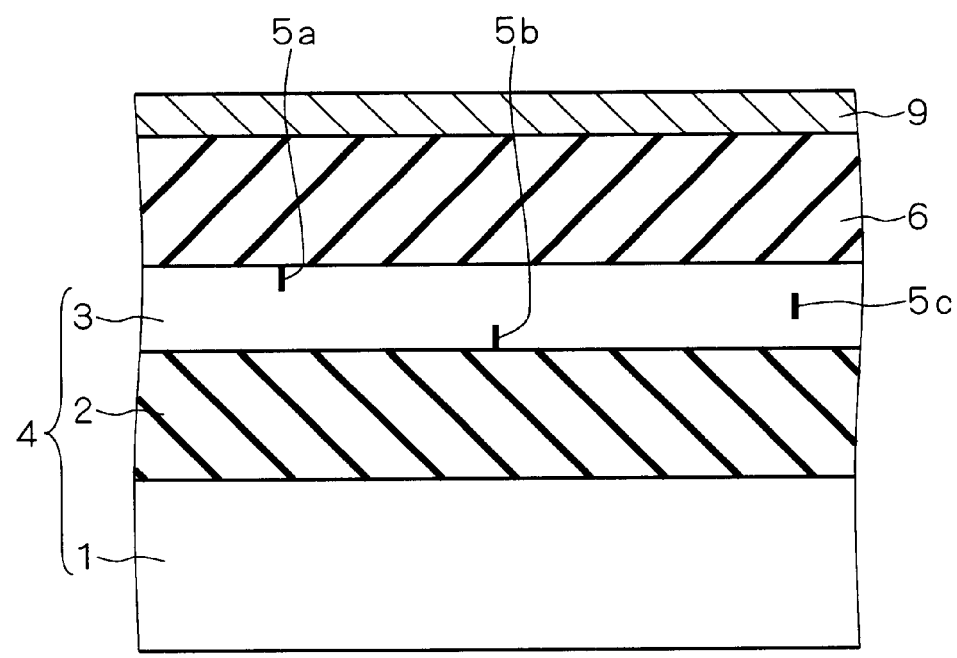
FIGS. 6 through 8 are sectional views for illustrating a method of evaluating a crystal defect according to a second preferred embodiment of the present invention in order of occurrence of respective steps.
Figure 7:
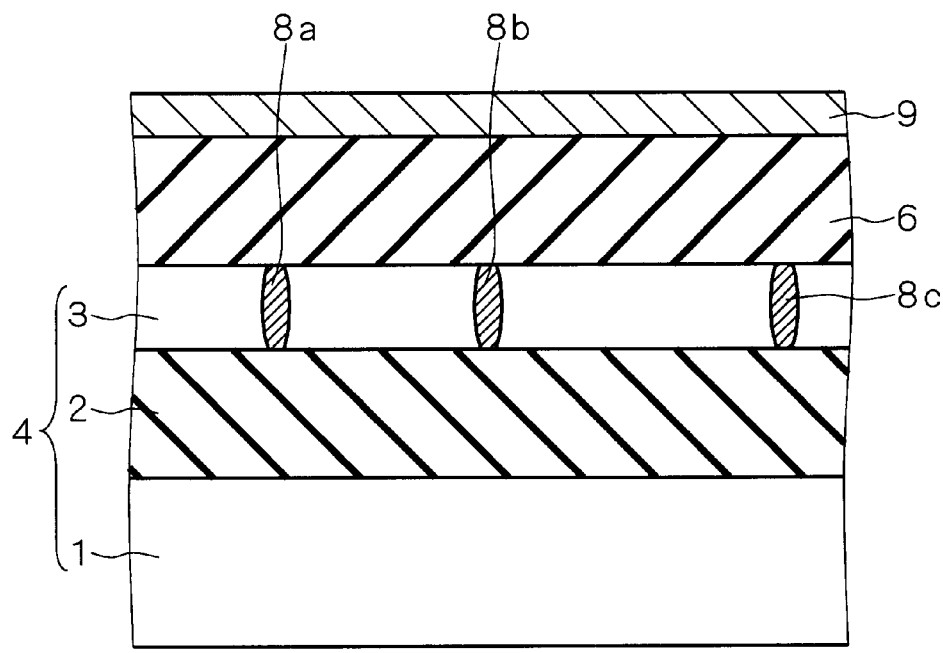
Figure 8:
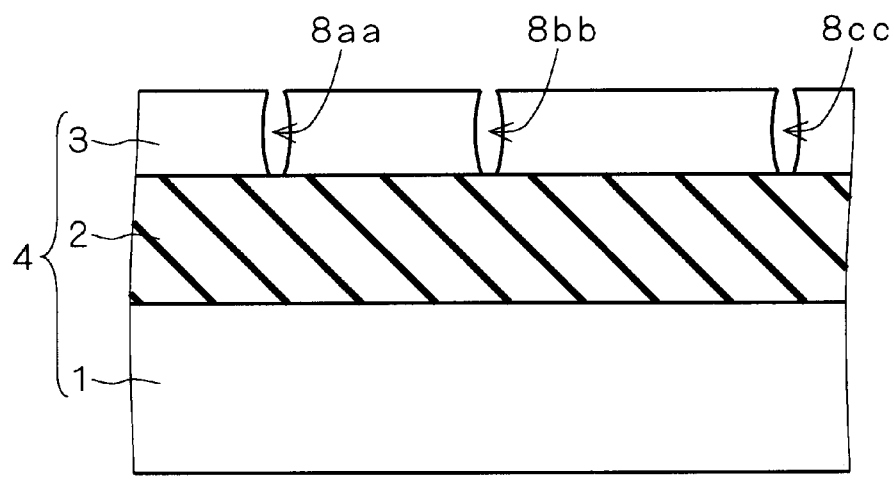

FIGS. 6 to 8 are sectional views of structures in the course of respective steps included in a method of evaluating a crystal defect according to a second preferred embodiment, for illustrating the method in order of occurrence of the respective steps. Referring to FIG. 6, first, the structure shown in FIG. 2 is formed by performing the same steps as described in the first preferred embodiment. Next, a metal film 9 is formed on the top face of the silicon oxide film 6. More specifically, the metal film 9 containing Mo, Ni, Ti, Co or the like is formed on the silicon oxide film 6 by using a sputtering technique. The metal film 9 has a thickness of approximately 1 to 20 nm.

Referring to FIG. 7, next, a heat treatment is carried out in an atmosphere of argon or nitrogen at a temperature in a range of approximately 700 to 1000° C. for 10 seconds or more by using an RTA technique. This treatment causes metals contained in the metal film 9 to pass through the silicon oxide film 6 and diffuse into the SOI layer 3. The metals diffusing within the SOI layer 3 are gettered by the crystal defects 5a to 5c in the SOI layer 3, so that the silicide regions 8a to 8c are formed in portions where the crystal defects 5a to 5c have existed, respectively, in the same manner as described in the first preferred embodiment. By performing the foregoing steps, the crystal defects 5a to 5c generated within the SOI layer 3 are detected. As such, FIGS. 6 and 7 illustrate a method of detecting a crystal defect according to the second preferred embodiment.

Referring to FIG. 8, next, the structure obtained by the foregoing steps is immersed in an HF solution for more than 1 minute or more. As a result, the metal film 9, the silicon oxide film 6 and the silicide regions 8a to 8c are subjected to a wet etching process and removed. Consequently, the cavities 8aa to 8cc are formed in portions where the silicide regions 8a to 8c have existed, respectively, in the SOI layer 3. By performing the foregoing steps, a semiconductor device for evaluation is manufactured. As such, FIGS. 6 to 8 illustrate a method of manufacturing a semiconductor device for evaluation according to the second preferred embodiment.

Then, observation of the structure shown in FIG. 8 is carried out from above the top face of the SOI layer 3 with an optical microscope or a scanning electron microscope, thereby to implement quantitative evaluation of the crystal defects generated in the SOI layer 3.

As described above, by using the method of evaluating a crystal defect according to the second preferred embodiment, similarly to the first preferred embodiment, it is possible to detect crystal defects without being affected by microroughness possibly caused in the top face of the SOI layer 3 or the interface between the bottom face of the SOI layer 3 and the top face of the buried oxide layer 2. This makes it possible to accurately evaluate the density of crystal defects generated within the SOI layer 3.

Further, the metal film 9 is formed not directly on the SOI layer 3, but on the silicon oxide film 6 which is formed on the SOI layer 3. Therefore, similarly to the first preferred embodiment, it is possible to prevent a silicide layer from being formed in an interface between the metal film 9 and the SOI layer 3 and becoming an obstacle to accurate evaluation of crystal defects. Moreover, it is possible to avoid generation of any additional defect in the top face of the SOI layer 3, also similarly to the first preferred embodiment.

Furthermore, the second preferred embodiment differs from the first preferred embodiment in that while the first preferred embodiment uses the technique of applying a solution and drying it for forming the metal film, the second preferred embodiment uses a sputtering technique for forming the metal film. A sputtering technique is utilized in many other steps of a manufacturing process for a semiconductor device, such as a step of silicidation on a gate electrode or a source/drain region, or a step of forming a metal interconnect. Therefore, by controlling the step of silicidation on a source/drain region such that a metal film formed during the silicidation step can exist also on the silicon oxide film 6, for example, it is possible to use the metal film formed during the silicidation step as the metal film 9. This eliminates the need of a step solely for forming the metal film 9, resulting in reduction of the number of process steps.

<Third Preferred Embodiment>

Figure 9:
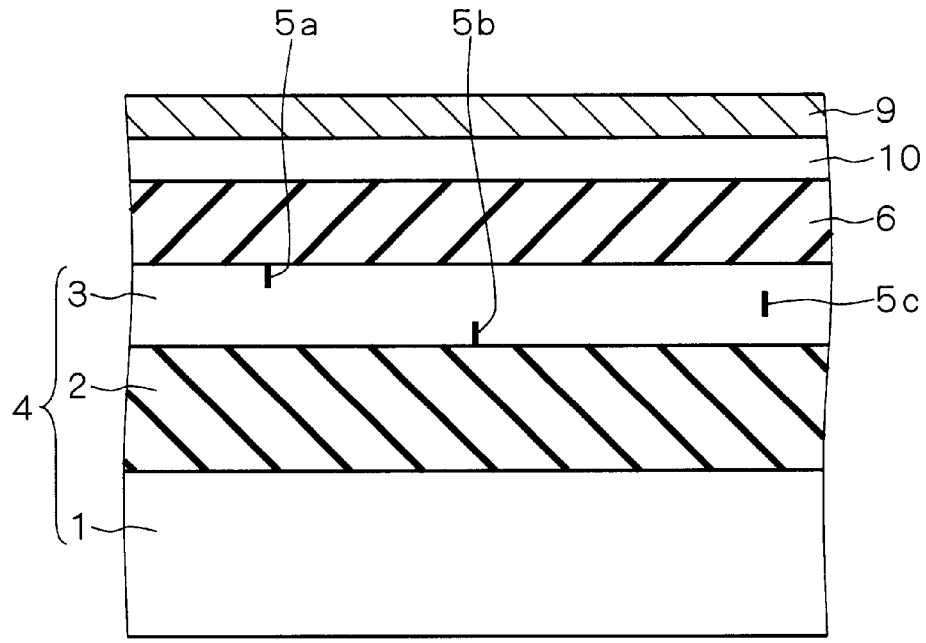
FIGS. 9 through 12 are sectional views for illustrating a method of evaluating a crystal defect according to a third preferred embodiment of the present invention in order of occurrence of respective steps.

FIGS. 9 to 12 are sectional views of structures in the course of respective steps included in a method of evaluating a crystal defect according to a third preferred embodiment, for illustrating the method in order of occurrence of the respective steps. Referring to FIG. 9, first, the structure shown in FIG. 6 is formed by performing the same steps as described in the second preferred embodiment. Next, a heat treatment is carried out in an atmosphere of argon or nitrogen at a temperature in a range of approximately 400 to 600° C. for 10 seconds or more by using an RTA technique. This treatment causes metals contained in the metal film 9 to diffuse into the top face of the silicon oxide film 6 and form a transition layer 10.

Figure 10:
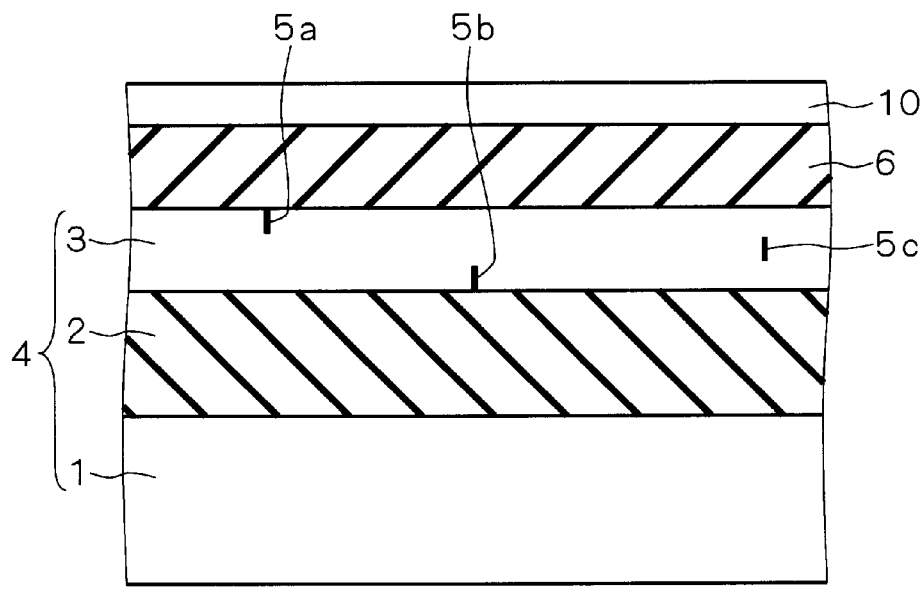

Referring to FIG. 10, next, the metal film 9 is removed by performing a wet etching process using an acid solution not containing HF such as hydrochloric acid, nitric acid, sulfuric acid and phosphoric acid, or a liquid mixture thereof. At that time, the transition layer 10 remains without being etched.

Figure 11:
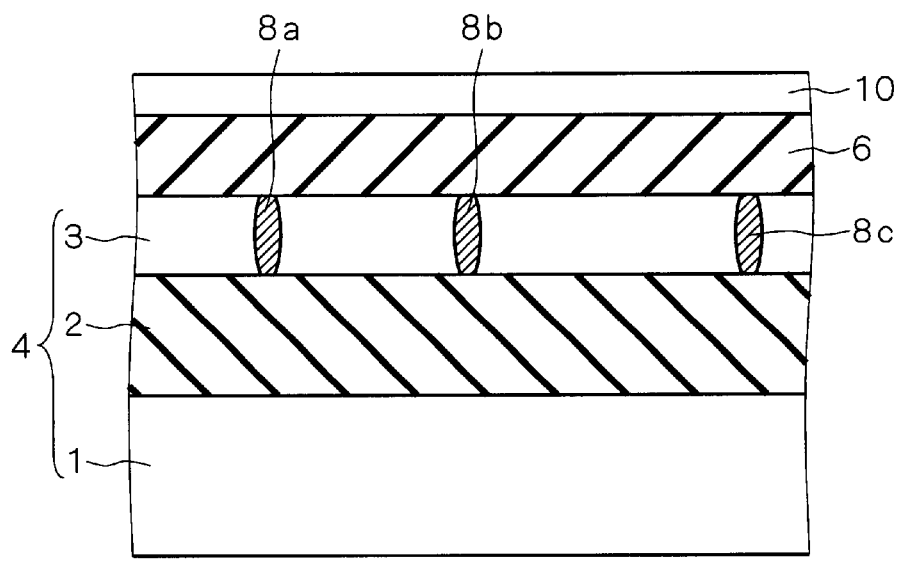

Referring to FIG. 11, next, a heat treatment is carried out in an atmosphere of argon or nitrogen at a temperature in a range of approximately 700 to 1000° C. for 10 seconds or more by using an RTA technique. This treatment causes metals contained in the transition layer 10 to pass through the silicon oxide film 6 and diffuse into the SOI layer 3. The metals diffusing within the SOI layer 3 are gettered by the crystal defects 5a to 5c in the SOI layer 3, so that the silicide regions 8a to 8c are formed in portions where the crystal defects 5a to 5c have existed, respectively, in the same manner as described in the first preferred embodiment. By performing the foregoing steps, the crystal defects 5a to 5c generated within the SOI layer 3 are detected. As such, FIGS. 9 to 11 illustrate a method of detecting a crystal defect according to the third preferred embodiment.

Figure 12:
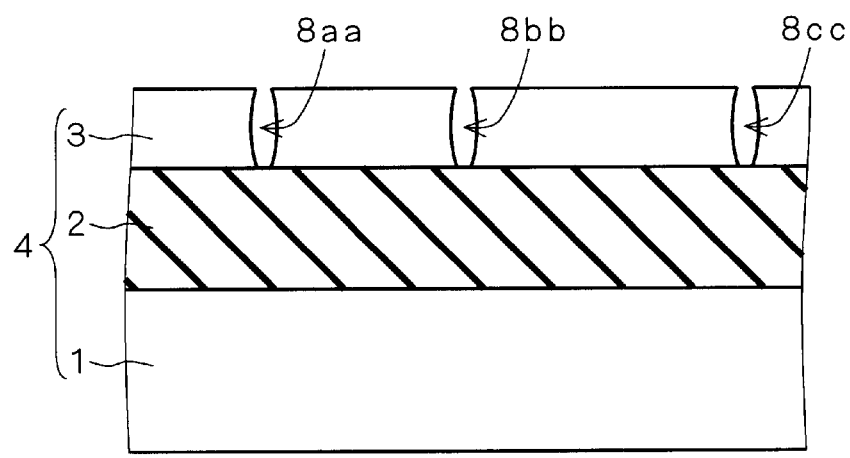

Referring to FIG. 12, then, the structure obtained by the foregoing steps is immersed in an HF solution for 1 minute or more. As a result, the transition layer 10, the silicon oxide film 6 and the silicide regions 8a to 8c are subjected to a wet etching process and removed. Consequently, the cavities 8aa to 8cc are formed in portions where the silicide regions 8a to 8c have existed, respectively, in the SOI layer 3. By performing the foregoing steps, a semiconductor device for evaluation is manufactured. As such, FIGS. 9 to 12 illustrate a method of manufacturing a semiconductor device for evaluation according to the third preferred embodiment.

Then, observation of the structure shown in FIG. 12 is carried out from above the top face of the SOI layer 3 with an optical microscope or a scanning electron microscope, thereby to implement quantitative evaluation of the crystal defects generated in the SOI layer 3.

As described above, by using the method of evaluating a crystal defect according to the third preferred embodiment, similarly to the first preferred embodiment, it is possible to detect crystal defects without being affected by microroughness possibly caused in the top face of the SOI layer 3 or the interface between the bottom face of the SOI layer 3 and the top face of the buried oxide layer 2. This makes it possible to accurately evaluate the density of crystal defects generated within the SOI layer 3.

Further, the transition layer 10 is formed not directly on the SOI layer 3, but on the silicon oxide film 6 which is formed on the SOI layer 3. Therefore, similarly to the first preferred embodiment, it is possible to prevent a silicide layer from being additionally formed in an interface between the transition layer 10 and the SOI layer 3 and becoming an obstacle to accurate evaluation of crystal defects. Moreover, it is possible to avoid generation of any additional defect in the top face of the SOI layer 3, also similarly to the first preferred embodiment.

Furthermore, a series of the steps of: forming the metal film by a sputtering technique; forming the transition layer by an RTA technique; removing the metal film by an etching process; and causing the silicidation reaction by an RTA technique, is similar to a series of steps for silicidation on a gate electrode or a source/drain region. Therefore, it is possible to form the silicide regions 8a to 8c in the same series of steps for silicidation on a gate electrode or a source/drain region.

<Fourth Preferred Embodiment>

Figure 13:
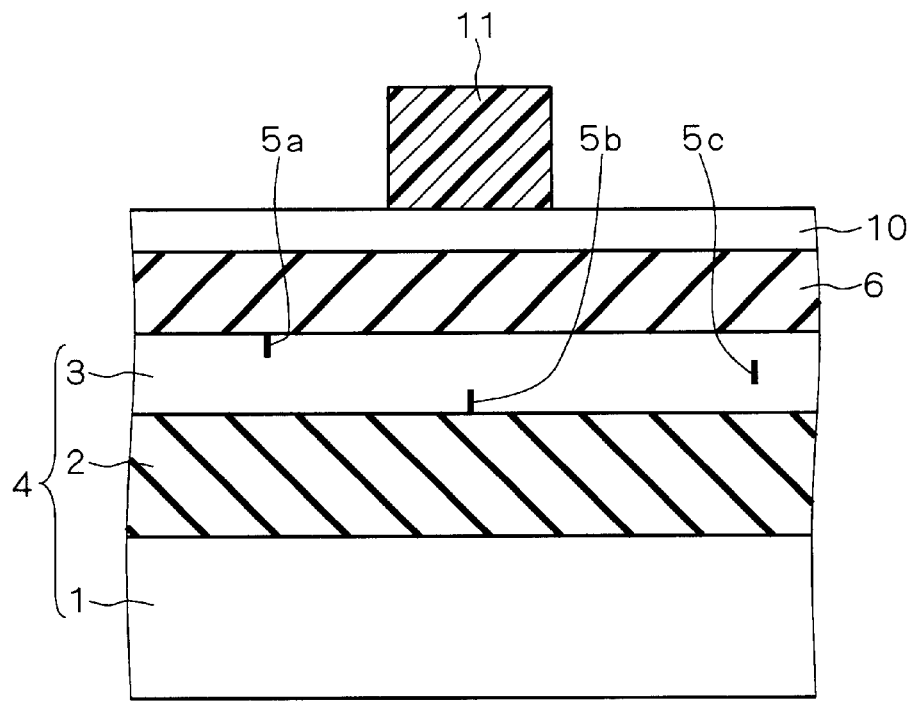
FIGS. 13 through 15 are sectional views for illustrating a method of evaluating a crystal defect according to a fourth preferred embodiment of the present invention in order of occurrence of respective steps.
Figure 14:
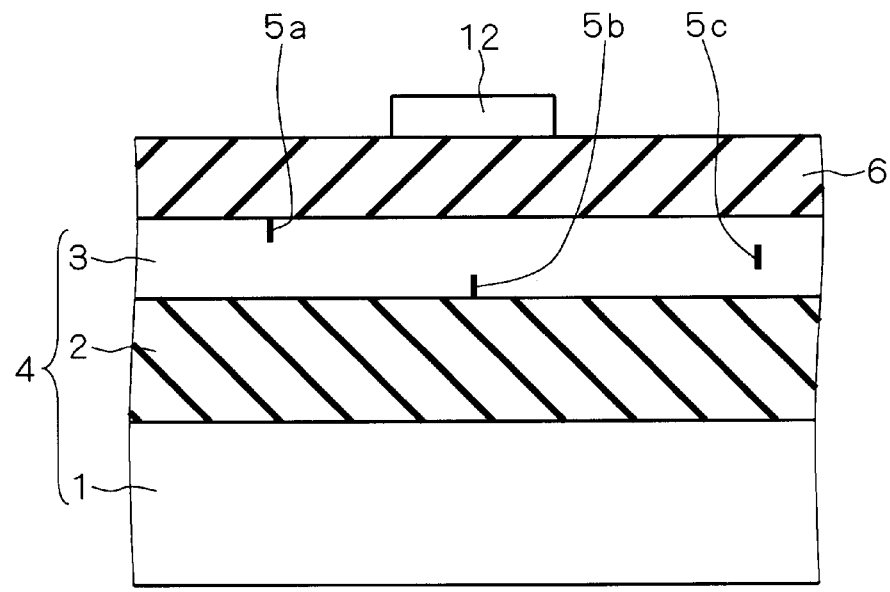
Figure 15:
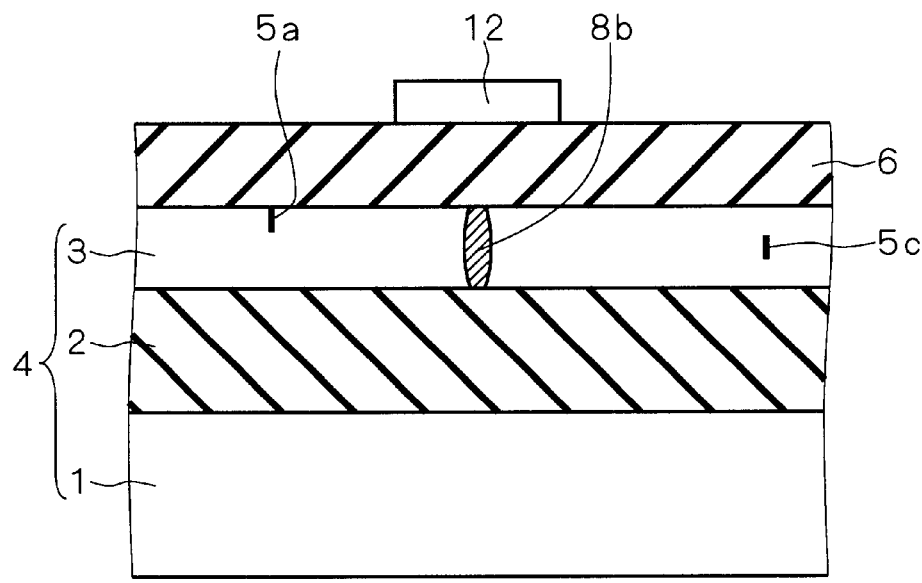

FIGS. 13 to 15 are sectional views of structures in the course of respective steps included in a method of evaluating a crystal defect according to a fourth preferred embodiment, for illustrating the method in order of occurrence of the respective steps. Referring to FIG. 13, first, the structure shown in FIG. 10 is formed by performing the same steps as described in the third preferred embodiment. Next, a photoresist 11 is formed on a portion of the transition layer 10 by a photolithography process. The photoresist 11 is formed above an evaluation region. In the instant description, a desired region to be subjected to evaluation of crystal defects in a film to which the evaluation of crystal defects is directed (in an instance illustrated in FIG. 13, the film is the SOI layer 3.) is referred to as the "evaluation region".

Referring to FIG. 14, next, an exposed portion of the transition layer 10 which is not covered with the photoresist 11 is removed by performing an etching process using the photoresist 11 as an etching mask. Accordingly, the portion of the transition layer 10 which is covered with the photoresist 11 remains without being etched, resulting in formation of a transition layer 12 above the evaluation region. Thereafter, the photoresist 11 is removed.

Referring to FIG. 15, next, a heat treatment is carried out in an atmosphere of argon or nitrogen at a temperature in a range of approximately 700 to 1000° C. for 10 seconds or more by using an RTA technique. This treatment causes metals contained in the transition layer 12 to pass through the silicon oxide film 6 located directly under the transition layer 12 and diffuse into the evaluation region of the SOI layer 3. The metals diffusing within the evaluation region are gettered by the crystal defects 5b in the evaluation region, so that the suicide regions 8b are formed in portions where the crystal defects 5b have existed in the same manner as described in the first preferred embodiment. On the other hand, the crystal defects 5a and 5c existing in region(s) other than the evaluation region of the SOI layer 3 remain without being silicided because the metals do not sufficiently diffuse in the other region(s) of the SOI layer 3. By performing the foregoing steps, only the crystal defects 5b generated within the evaluation region are detected.

Then, after the transition layer 12, the silicon oxide film 6 and the silicide regions 8b are removed, observation of the resulting structure is carried out with an optical microscope or a scanning electron microscope, similarly to the third preferred embodiment, thereby to implement quantitative evaluation of crystal defects generated in the evaluation region.

Additionally, the above description discusses only a case in which the present invention according to the fourth preferred embodiment is applied to, and based on, the third preferred embodiment. However, the present invention according to the fourth preferred embodiment is applicable also to the first or second preferred embodiment.

As described above, the method of evaluating a crystal defect according to the fourth preferred embodiment produces the same advantages as produced by the first through third preferred embodiments, and produces a further advantage of making it possible to arbitrarily specify a region to be subjected to detection and evaluation of crystal defects in the SOI layer 3.

<Fifth Preferred Embodiment>

A fifth preferred embodiment will describe a case where the evaluation methods according to the first through fourth preferred embodiments are applied to evaluation of crystal defects generated within the SOI layer 3 due to a manufacturing process for a semiconductor device, not crystal defects generated within the SOI layer 3 during manufacture of the SOI substrate 4.

Figure 16:
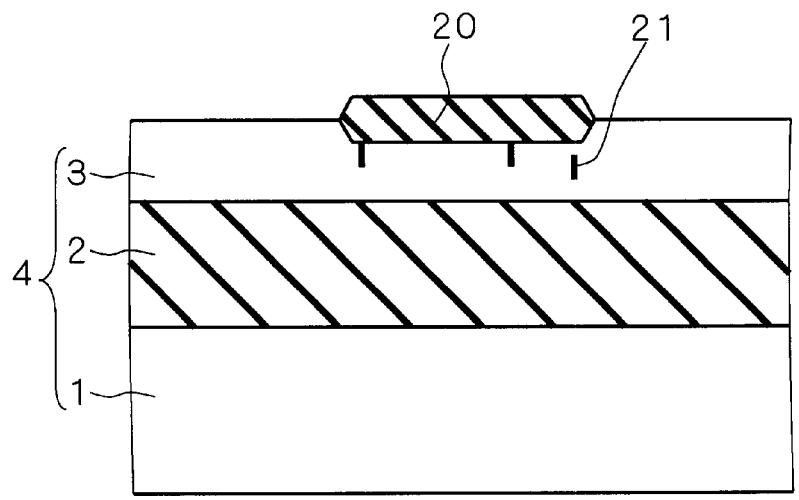
FIGS. 16 and 17 are sectional views for illustrating a first method of detecting a crystal defect according to a fifth preferred embodiment of the present invention in order of occurrence of respective steps.
Figure 17:
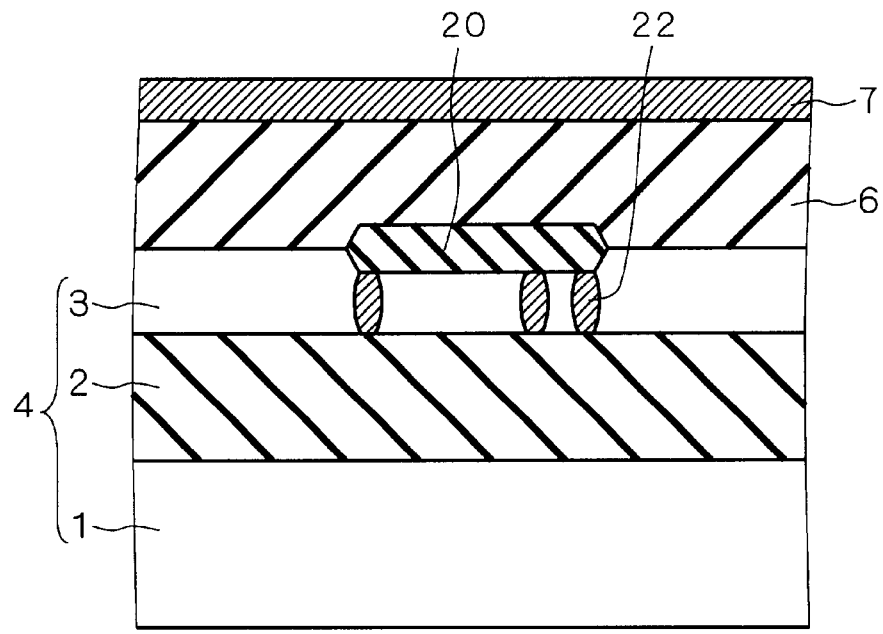

FIGS. 16 and 17 are sectional views of structures in the course of respective steps included in a first method of evaluating a crystal defect according to the fifth preferred embodiment, for illustrating the method in order of occurrence of the respective steps. Referring to FIG. 16, first, the SOI substrate 4 is prepared, and an isolation insulating film 20 is formed within the top face of the SOI layer 3 by using a well-known LOCOS isolation technique or trench isolation technique. The formation of the isolation insulating film 20 causes generation of crystal defects 21 within the SOI layer 3.

Referring to FIG. 17, next, the silicon oxide film 6 and the metal film 7 are formed sequentially in this order, and a heat treatment is carried out by an RTA technique, in the same manner as described in the first preferred embodiment. The heat treatment causes metals contained in the metal film 7 to pass through the silicon oxide film 6 and the isolation insulating film 20 and diffuse into the SOI layer 3, where the metals are gettered by the crystal defects 21. As a result, silicide regions 22 which are regions silicided are formed. By performing the foregoing steps, the crystal defects 21 generated within the SOI layer 3 due to the formation of the isolation insulating film 20 are detected.

Thereafter, the metal film 7, the silicon oxide film 6, the isolation insulating film 20 and the silicide regions 22 are removed by performing a wet etching process using an HF solution. Then, observation of the SOI layer 3 is carried out with an optical microscope or a scanning electron microscope. In this manner, the crystal defects generated within the SOI layer 3 due to the formation of the isolation insulating film 20 are evaluated.

Figure 18:
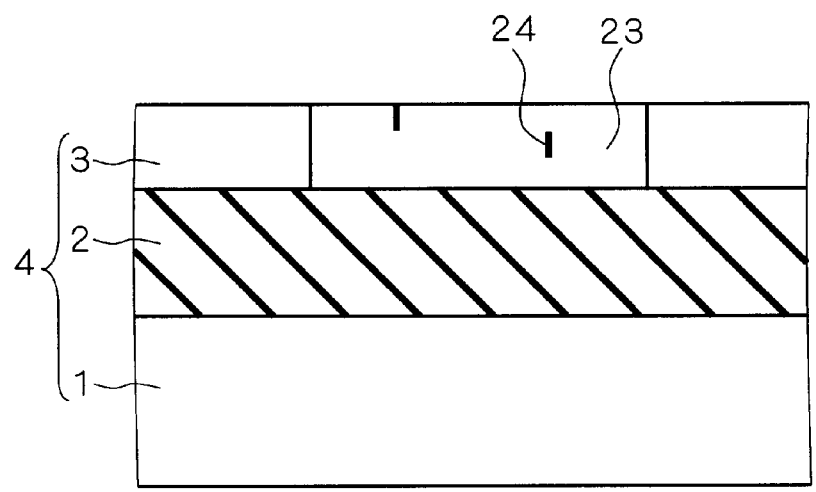
FIGS. 18 and 19 are sectional views for illustrating a second method of detecting a crystal defect according to the fifth preferred embodiment of the present invention in order of occurrence of respective steps.
Figure 19:
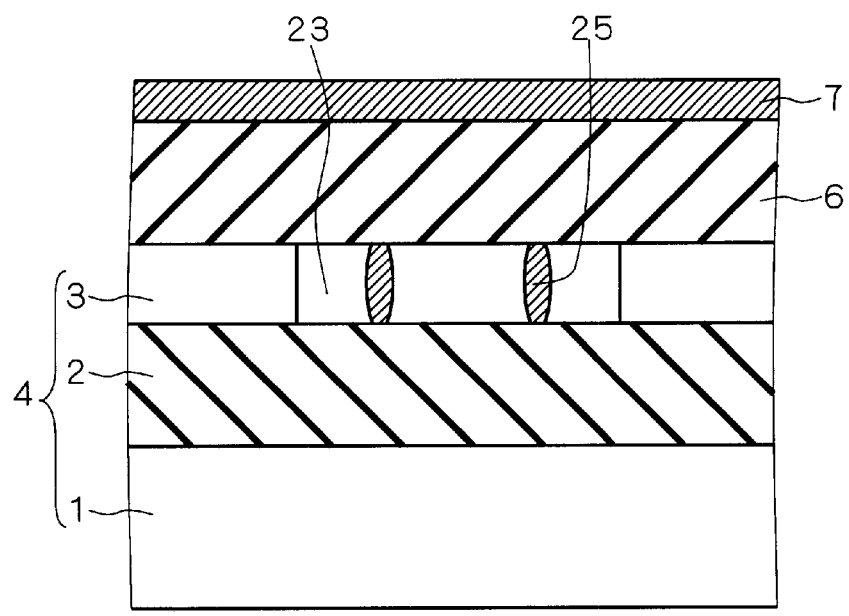

FIGS. 18 and 19 are sectional views of structures in the course of respective steps included in a second method of evaluating a crystal defect according to the fifth preferred embodiment, for illustrating the method in order of occurrence of the respective steps. Referring to FIG. 18, first, the SOI substrate 4 is prepared, and an ion implantation region 23 where ions are implanted is formed within the SOI layer 3 by ion implantation. The formation of the ion implantation region 23 causes generation of crystal defects 24 within the SOI layer 3.

Referring to FIG. 19, next, the silicon oxide film 6 and the metal film 7 are formed sequentially in this order, and a heat treatment is carried out by an RTA technique, in the same manner as described in the first preferred embodiment. The heat treatment causes metals contained in the metal film 7 to pass through the silicon oxide film 6 and diffuse into the SOI layer 3, where the metals are gettered by the crystal defects 24. As a result, silicide regions 25 which are regions silicided are formed. By performing the foregoing steps, the crystal defects 24 generated within the SOI layer 3 due to the formation of the ion implantation region 23 are detected.

Thereafter, the metal film 7, the silicon oxide film 6, and the silicide regions 25 are removed by performing a wet etching process using an HF solution. Then, observation of the SOI layer 3 is carried out with an optical microscope or a scanning electron microscope. In this manner, the crystal defects generated within the SOI layer 3 due to the formation of the ion implantation region 23 are evaluated.

Figure 20:
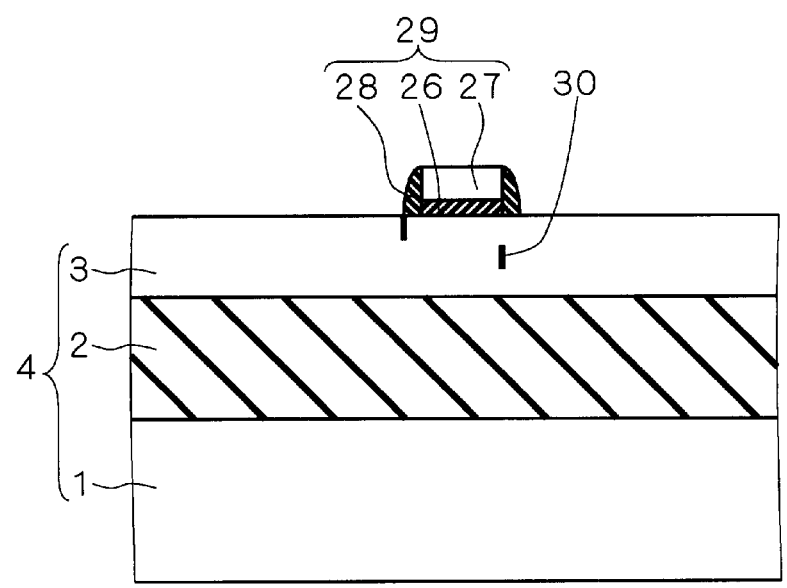
FIGS. 20 and 21 are sectional views for illustrating a third method of detecting a crystal defect according to the fifth preferred embodiment of the present invention in order of occurrence of respective steps.
Figure 21:
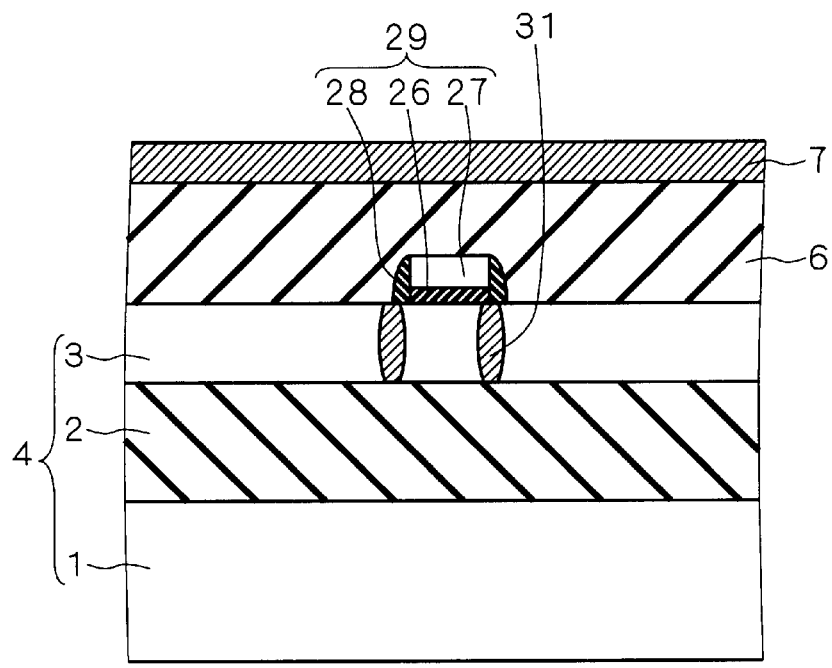

FIGS. 20 and 21 are sectional views of structures in the course of respective steps included in a third method of evaluating a crystal defect according to the fifth preferred embodiment, for illustrating the method in order of occurrence of the respective steps. Referring to FIG. 20, first, the SOI substrate 4 is prepared, and a gate structure 29 is formed on the top face of the SOI layer 3. The gate structure 29 has a gate insulating film 26, a gate electrode 27 and a sidewall 28 made of an insulating film. The gate structure 29 is formed by using a well-known forming process such as a CVD process or an anisotropic dry etching process. The formation of the gate structure 29 causes generation of crystal defects 30 within the SOI layer 3.

Referring to FIG. 21, next, the silicon oxide film 6 and the metal film 7 are formed sequentially in this order, and a heat treatment is carried out by an RTA technique, in the same manner as described in the first preferred embodiment. The heat treatment causes metals contained in the metal film 7 to pass through the silicon oxide film 6 and the sidewall 28 and diffuse into the SOI layer 3, where the metals are gettered by the crystal defects 30. As a result, silicide regions 31 which are regions silicided are formed. By performing the foregoing steps, the crystal defects 30 generated within the SOI layer 3 due to the formation of the gate structure 29 are detected.

Thereafter, the metal film 7, the silicon oxide film 6, the sidewall 28 and the silicide regions 31 are removed by performing a wet etching process using an HF solution. Then, observation of the SOI layer 3 is carried out with an optical microscope or a scanning electron microscope. In this manner, the crystal defects generated within the SOI layer 3 due to the formation of the gate structure 29 are evaluated.

Figure 22:
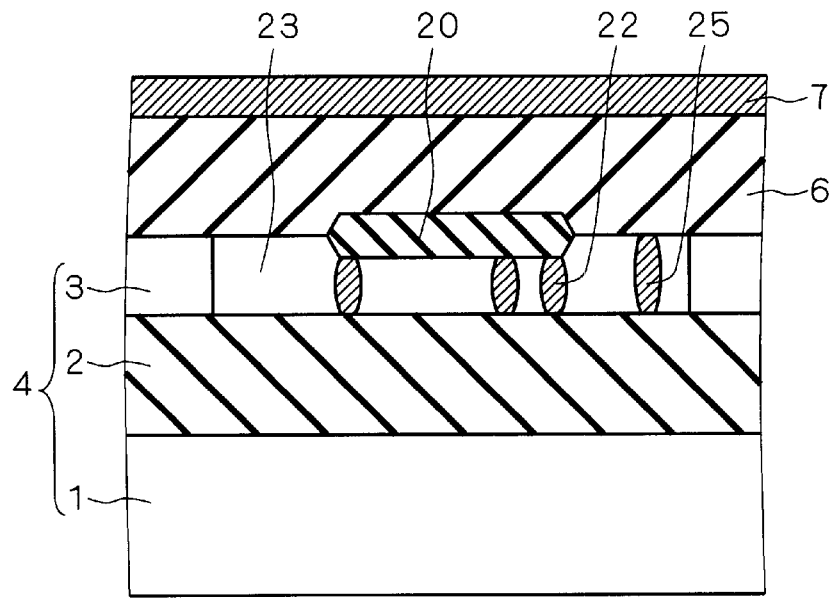
FIG. 22 is a sectional view for illustrating a step included in a fourth method of detecting a crystal defect according to the fifth preferred embodiment of the present invention.

FIG. 22 is a sectional view of a structure in the course of a step included in a fourth method of evaluating a crystal defect according to the fifth preferred embodiment, for illustrating the method. The structure shown in FIG. 22 is obtained by performing the steps (each previously described) of: preparing the SOI substrate 4; forming the isolation insulating film 20 and the ion implantation region 23; forming the silicon oxide film 6; forming the metal film 7; and carrying out a heat treatment by using an RTA technique, in this order. As a result, the silicide regions 22 are formed consequently upon generation of the crystal defects 21 generated within the SOI layer 3 due to the formation of the isolation insulating film 20, and also the silicide regions 25 are formed consequently upon generation of the crystal defects 24 generated within the SOI layer 3 due to the formation of the ion implantation region 23.

Thereafter, the metal film 7, the silicon oxide film 6, the isolation insulating film 20 and the silicide regions 22 and 25 are removed by performing a wet etching process using an HF solution. Then, observation of the SOI layer 3 is carried out with an optical microscope or a scanning electron microscope. In this manner, the crystal defects generated within the SOI layer 3 due to the formation of the isolation insulating film 20 and the ion implantation region 23 are evaluated.

Figure 23:
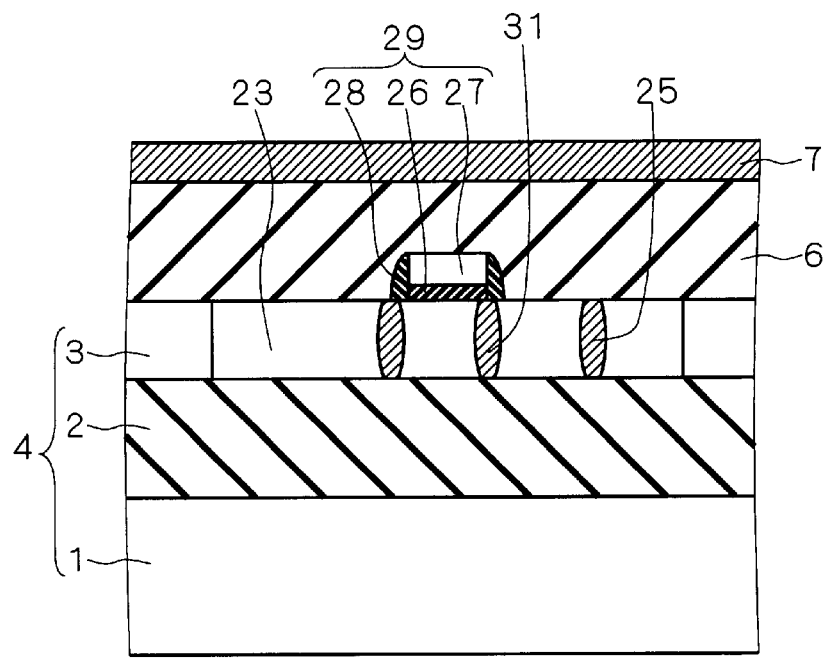
FIG. 23 is a sectional view for illustrating a step included in a fifth method of detecting a crystal defect according to the fifth preferred embodiment of the present invention.

FIG. 23 is a sectional view of a structure in the course of a step included in a fifth method of evaluating a crystal defect according to the fifth preferred embodiment, for illustrating the method. The structure shown in FIG. 23 is obtained by performing the steps (each previously described) of: preparing the SOI substrate 4; forming the ion implantation region 23 and the gate structure 29; forming the silicon oxide film 6; forming the metal film 7; and carrying out a heat treatment by using an RTA technique, in this order. As a result, the silicide regions 25 are formed consequently upon generation of the crystal defects 24 within the SOI layer 3 due to the formation of the ion implantation region 23, and also the silicide regions 31 are formed consequently upon generation of the crystal defects 30 within the SOI layer 3 due to the formation of the gate structure 29.

Thereafter, the metal film 7, the silicon oxide film 6, the sidewall 28 and the silicide regions 25 and 31 are removed by performing a wet etching process using an HF solution. Then, observation of the SOI layer 3 is carried out with an optical microscope or a scanning electron microscope. In this manner, the crystal defects generated within the SOI layer 3 due to the formation of the ion implantation region 23 and the gate structure 29 are evaluated.

Additionally, the above description discusses only a case where the present invention according to the fifth preferred embodiment is applied to, and based on, the first preferred embodiment. However, the present invention according to the fifth preferred embodiment is applicable also to the second through fourth preferred embodiments.

As described above, by using the methods of evaluating a crystal defect according to the fifth preferred embodiment, similarly to the first preferred embodiment, it is possible to detect crystal defects without being affected by microroughness possibly caused in the top face of the SOI layer 3 or the interface between the bottom face of the SOI layer 3 and the top face of the buried oxide layer 2. This makes it possible to accurately evaluate the density of crystal defects generated within the SOI layer 3 due to a manufacturing process for a semiconductor device.

<Sixth Preferred Embodiment>

Figure 24:
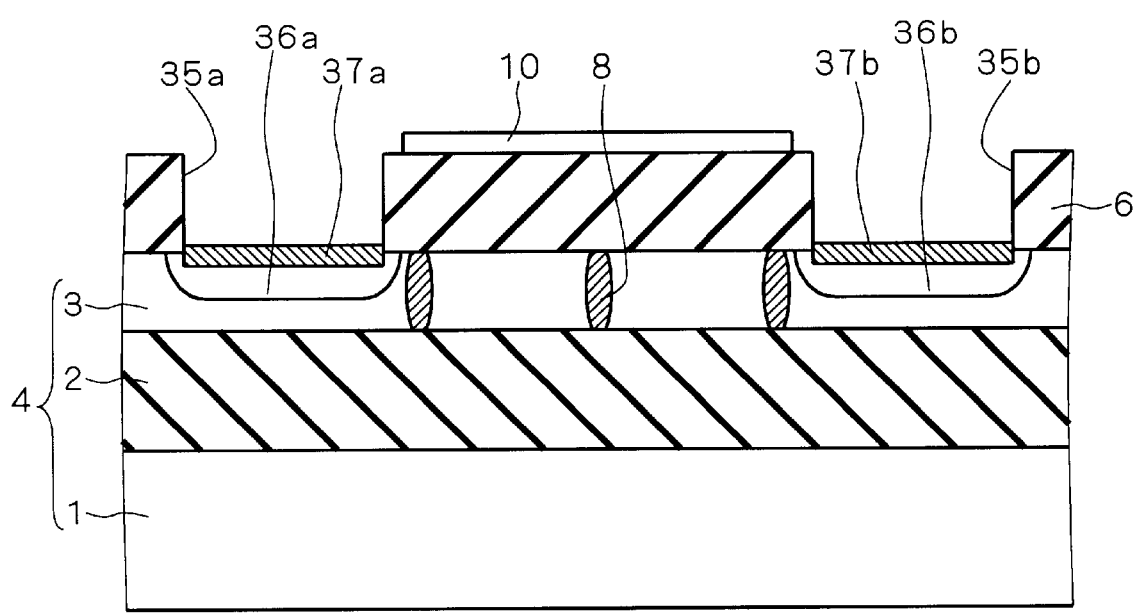
FIG. 24 is a sectional view showing a structure of a first semiconductor device for evaluation according to a sixth preferred embodiment of the present invention.

FIG. 24 is a sectional view of a structure of a first semiconductor device for evaluation according to a sixth preferred embodiment. The SOI layer 3 has the silicon oxide film 6 formed on the top face thereof. Further, the transition layer 10 is formed on a portion of the silicon oxide film 6 located above the evaluation region of the SOI layer 3. The silicon oxide film 6 includes recesses 35a and 35b on opposite sides of the portion of the silicon oxide film 6 above the evaluation region. Portions of the top face of the SOI layer 3 which define bottom faces of the recesses 35a and 35b, respectively, have heavily doped impurity diffusion regions 36a and 36b formed therein, respectively. Each of the heavily doped impurity diffusion regions 36a and 36b has the same conductivity type as the SOI layer 3, and has an impurity concentration of approximately $1E18/cm^3$. Further, silicide layers 37a and 37b are formed in top faces of the heavily doped impurity diffusion regions 36a and 36b, respectively, which provides for reduction in resistance. Moreover, silicide regions 8 which are regions silicided are formed within the evaluation region due to crystal defects generated within the SOI layer 3 during manufacture of the SOI substrate 4.

Below, a method of evaluating a crystal defect using the semiconductor device for evaluation shown in FIG. 24 will be described. First, a first probe not shown is inserted into the recess 35a so that the first probe penetrates the recess 35a, to come into contact with the silicide layer 37a. Also, a second probe not shown is inserted into the recess 35b so that the second probe penetrates the recess 35b, to come into contact with the silicide layer 37b. At that time, as the SOI layer 3 has the heavily doped impurity diffusion regions 36a and 36b formed therein, ohmic contacts are produced between each of the first and second probes and the SOI layer 3. The first and second probes are connected to each other via an ampere meter capable of monitoring an extremely small amount of current of the order of pA, which results in formation of a closed circuit including the evaluation region of the SOI layer 3.

Next, a laser beam is irradiated into the evaluation region via the transition layer 10 and the silicon oxide film 6. The irradiation induces excess carriers in a portion irradiated with the laser beam. Each of the induced excess carriers is separated due to a potential difference in an interface between each of the silicide regions 8 and a portion containing silicon of the SOI layer 3, so that the excess carriers are turned into an electric current. Then, by monitoring the electric current flowing between the first and second probes using the ampere meter while scanning the evaluation region with a laser beam, it is possible to evaluate crystal defects within the evaluation region. The technique explained above is called "OBIC (Optical Beam Induced Current)" technique in general.

FIG. 25 is a sectional view of a structure of a second semiconductor device for evaluation according to the sixth preferred embodiment. The structure shown in FIG. 25 is obtained by forming an interlayer insulating film 38 made of a silicon oxide film over the structure shown in FIG. 24. The interlayer insulating film 38 has contact plugs 39a and 39b which are connected to the silicide layers 37a and 37b, respectively, formed therein. The contact plugs 39a and 39b are provided on opposite sides of a portion of the film 38 located above the evaluation region. Further, metal interconnects 40a and 40b connected to the contact plugs 39a and 39b, respectively, are formed on the interlayer insulating film 38. The metal interconnects 40a and 40b are connected with each other via an ampere meter capable of monitoring an extremely small amount of current of the order of pA, which results in formation of a closed circuit including the evaluation region of the SOI layer 3.

Then, by monitoring a current flowing between the metal interconnects 40a and 40b using the ampere meter while irradiating the evaluation region with a laser beam via the interlayer insulating film 38, the transition layer 10 and the silicon oxide film 6, to scan the evaluation region, it is possible to evaluate crystal defects within the evaluation region.

FIGS. 26 to 31 are sectional views of structures in the course of respective steps of a method of manufacturing the semiconductor device for evaluation shown in FIG. 24, for illustrating the method in order of occurrence of the respective steps. Referring to FIG. 26, first, the SOI substrate 4 is prepared, and a photoresist 45 including a predetermined pattern for openings is formed on the top face of the SOI layer 3 by a photolithography process. The SOI layer 3 contains crystal defects 5 which are generated during manufacture of the SOI substrate 4. Next, impurity ions are implanted into the top face of the SOI layer 3 using the photoresist 45 as an implantation mask, to form the heavily doped impurity diffusion regions 36a and 36b.

Figure 27:
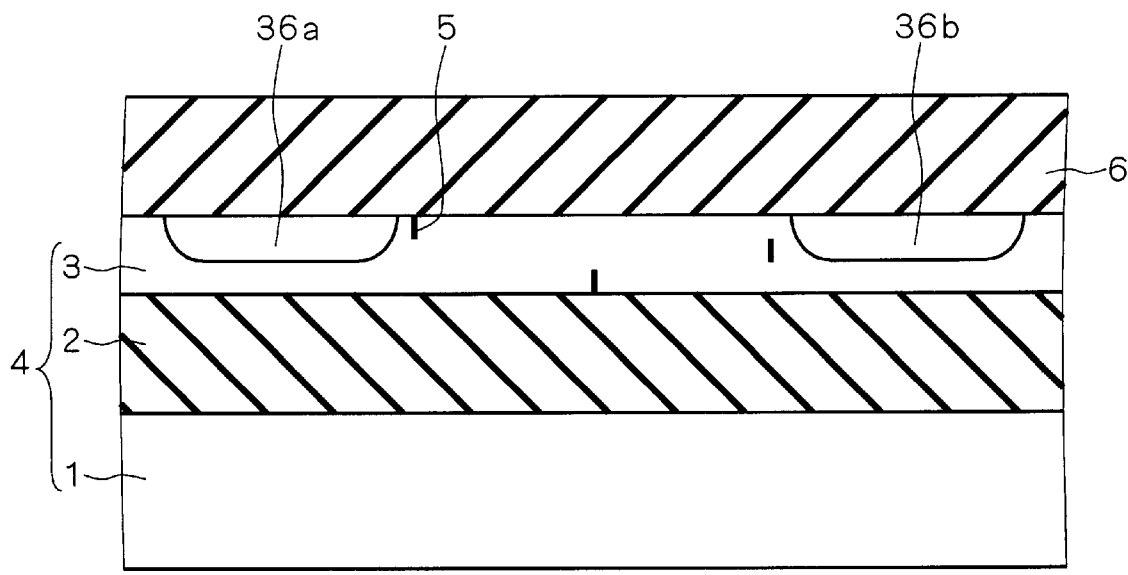
Figure 28:
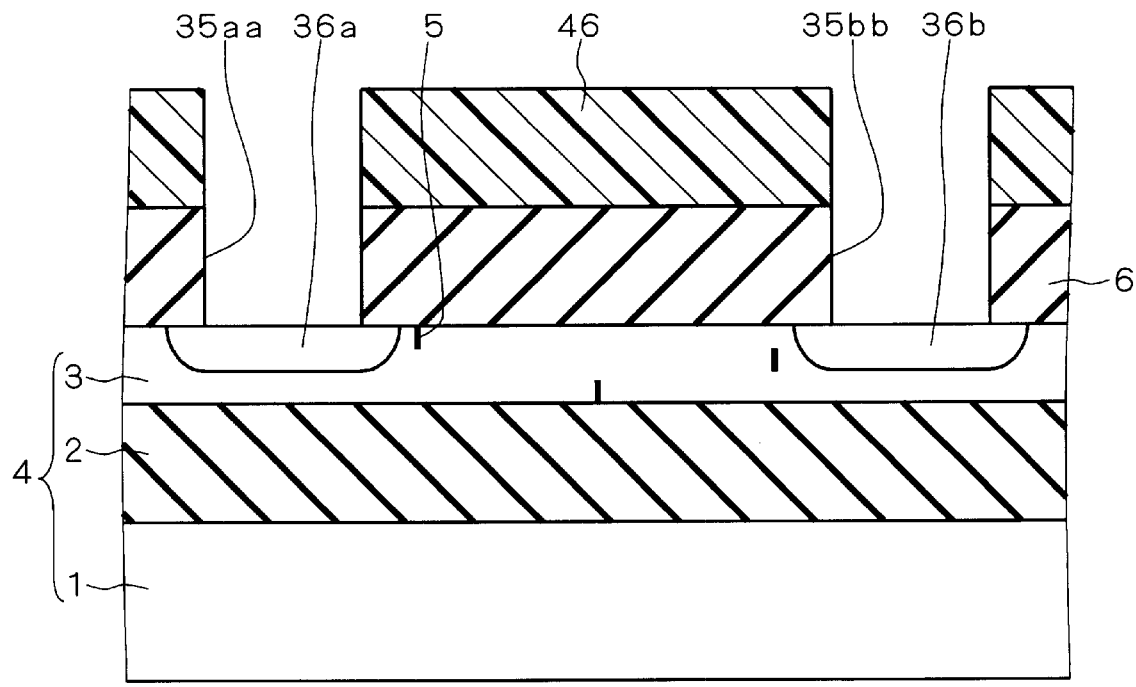

Referring to FIG. 27, next, the photoresist 45 is removed, and the silicon oxide film 6 is formed on the top face of the SOI layer 3 by the thermal CVD process or the plasma CVD process. Referring to FIG. 28, next, a photoresist 46 including a predetermined pattern for openings is formed on the top face of the silicon oxide film 6 by a photolithography process. Subsequently, the silicon oxide film 6 is etched by an anisotropic dry etching process (or a wet etching process) using the photoresist 46 as an etching mask, to form recesses 35aa and 35bb having bottom faces defined by the heavily doped impurity diffusion regions 36a and 36b, respectively.

Referring to FIG. 29, the photoresist 46 is removed, and the metal film 9 is formed over the entire surface of resulting structure by using a sputtering technique. Thereafter, a heat treatment is carried out by using an RTA technique. This heat treatment causes formation of the transition layer 10 in a portion(s) of the surface of the silicon oxide film 6, which portion is in contact with the metal film 9. At the same time, transition layers 47a and 47b are formed in portions of the top face of the SOI layer 3, which portions are in contact with the metal film 9.

Then, referring to FIG. 30, the metal film 9 is removed by performing a wet etching process using an acid solution not containing HF, in the same manner as described in the third preferred embodiment.

Figure 31:
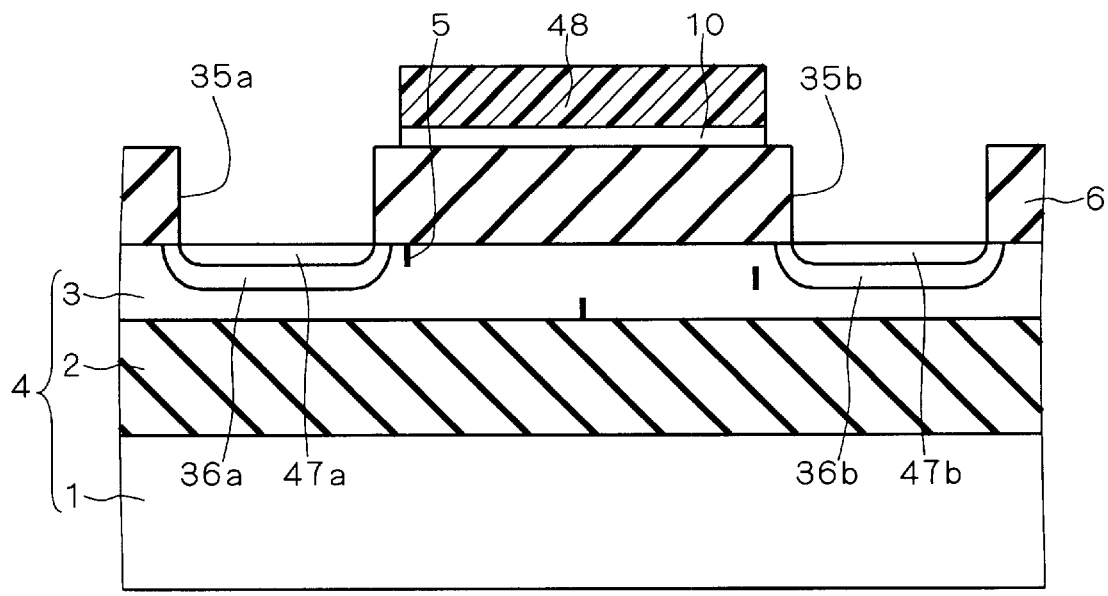

Referring to FIG. 31, a photoresist 48 is formed on the top face of a portion of the transition layer 10, which portion is located above the evaluation region, by a photolithography process. Subsequently, an exposed portion of the transition layer 10 which is not covered with the photoresist 48 is removed by performing an etching process using the photoresist 48 as an etching mask.

Then, the photoresist 48 is removed, and a heat treatment is carried out by using an RTA technique. The heat treatment causes metals contained in the transition layer 10 to diffuse into the SOI layer 3, where the metals are gettered by the crystal defects 5. Accordingly, the silicide regions 8 are formed and the transition layers 47a and 47b are silicided to form the silicide layers 37a and 37b. By performing the foregoing steps, the structure shown in FIG. 24 is obtained.

Additionally, the above description discusses only a case where the present invention according to the sixth preferred embodiment is applied to, and based on, the third or fourth preferred embodiment. However, the present invention according to the sixth preferred embodiment is applicable to the first or second preferred embodiment.

As described above, the semiconductor devices for evaluation according to the sixth preferred embodiment allow the crystal defects 5 generated during manufacture of the SOI substrate 4 to be evaluated using an in-line test which employs an OBIC technique while avoiding performing a destructive test which is required in a preferential etching process included in the conventional evaluation method.

<Seventh Preferred Embodiment>

A seventh preferred embodiment will describe a case where the semiconductor device for evaluation according to the sixth preferred embodiment is applied to evaluation of crystal defects generated within the SOI layer 3 due to a manufacturing process for a semiconductor device, not crystal defects generated within the SOI layer 3 during manufacture of the SOI substrate 4.

Figure 32:
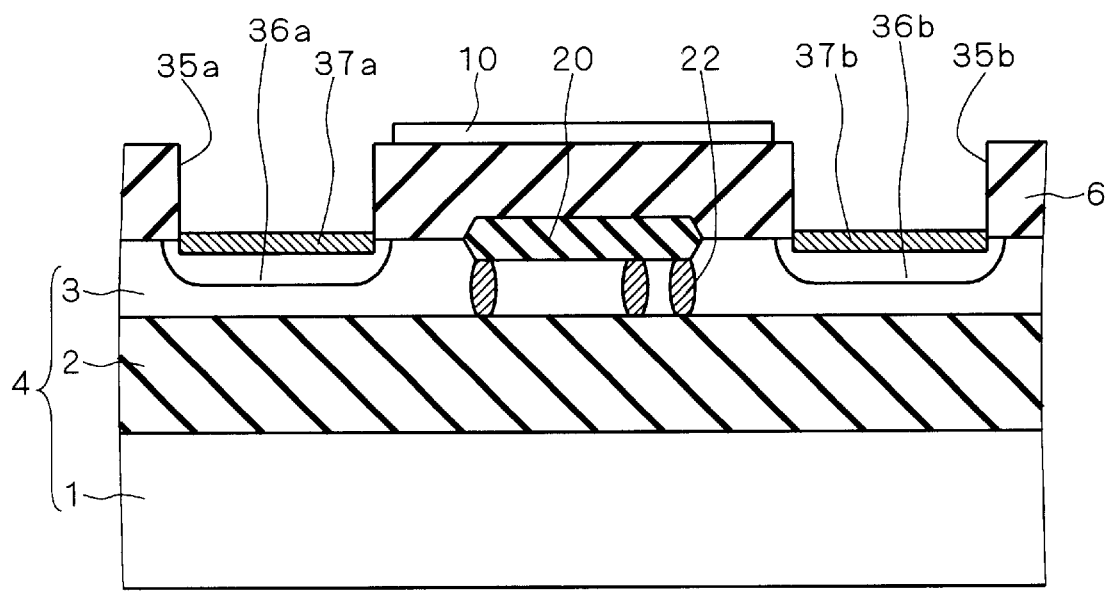
FIG. 32 is a sectional view showing a structure of a first semiconductor device for evaluation according to a seventh preferred embodiment of the present invention.

FIG. 32 is a sectional view showing a structure of a first semiconductor device for evaluation according to the seventh preferred embodiment. The SOI layer 3 has the isolation insulating film 20 formed in the evaluation region therein. Further, the silicide regions 22 are formed in the evaluation region of the SOI layer 3 consequently upon generation of the crystal defects 21 within the SOI layer 3 due to the formation of the isolation insulating film 20. The first semiconductor device for evaluation according to the seventh preferred embodiment can be manufactured by employing the same method of manufacturing the semiconductor device for evaluation according to the sixth preferred embodiment except that the isolation insulating film 20 is formed prior to the step of forming the silicon oxide film 6 (FIG. 27).

Figure 37:
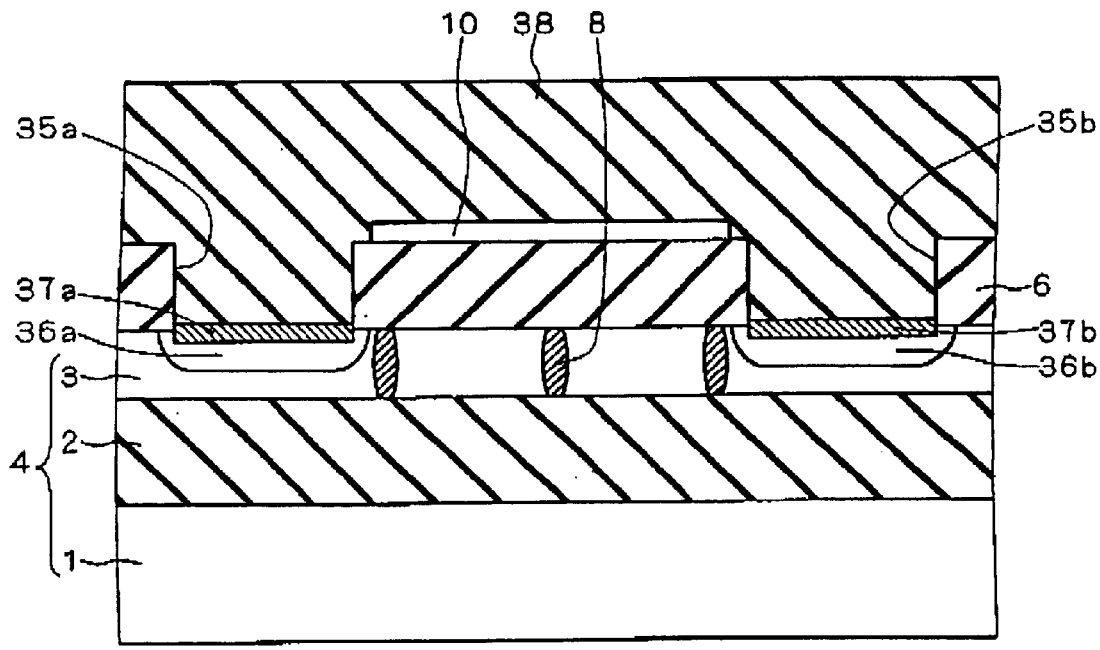
FIG. 37 is a sectional view of the structure shown in FIG. 25 detailing the formation of a silicon oxide film
Figure 38:
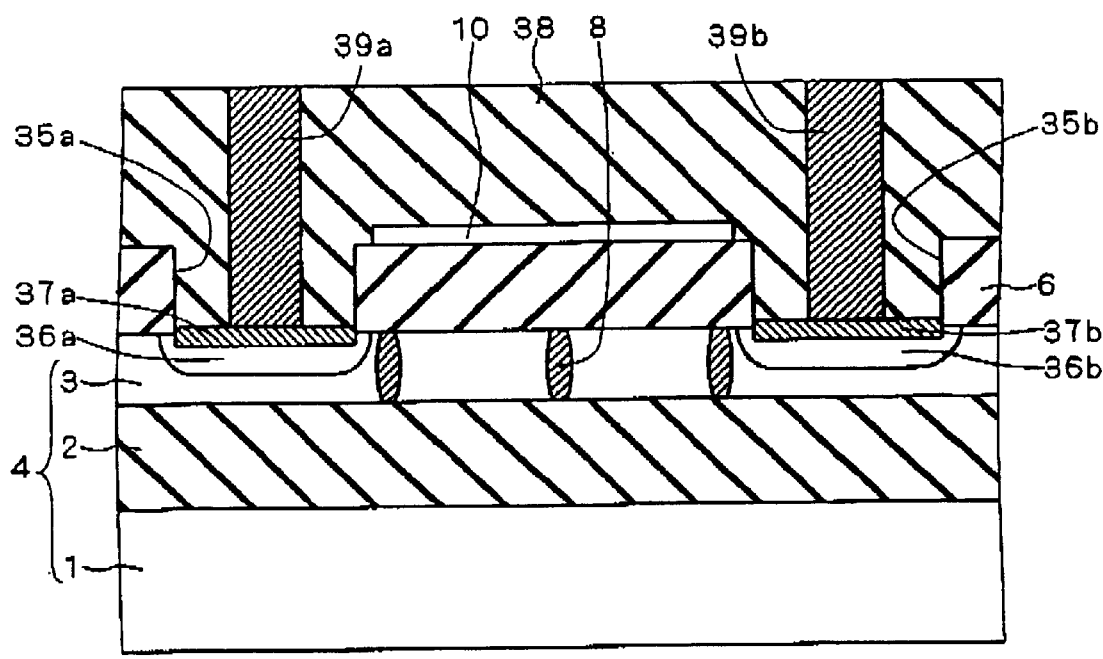
FIG. 38 is a sectional view of the structure shown in FIG. 25 detailing the formation of contact plugs.

FIGS. 37 and 38 are sectional views of structures in the course of respective steps of a method of manufacturing the semiconductor device for evaluation shown in FIG. 25, for illustrating the method in order of occurrence of the respective steps. Referring to FIG. 37, first, the interlayer insulating film 38 made of a silicon oxide film is formed on the structure shown in FIG. 24. Next, referring to FIG. 38, the contact plugs 39a and 39b which are connected to the silicide layers 37a and 37b, respectively, are formed in the interlayer insulating film 38. Thereafter, the structure shown in FIG. 25 is obtained by forming the metal interconnects 40a and 40b connected to the contact plugs 39a and 39b, respectively, on the interlayer insulating film 38.

Figure 33:
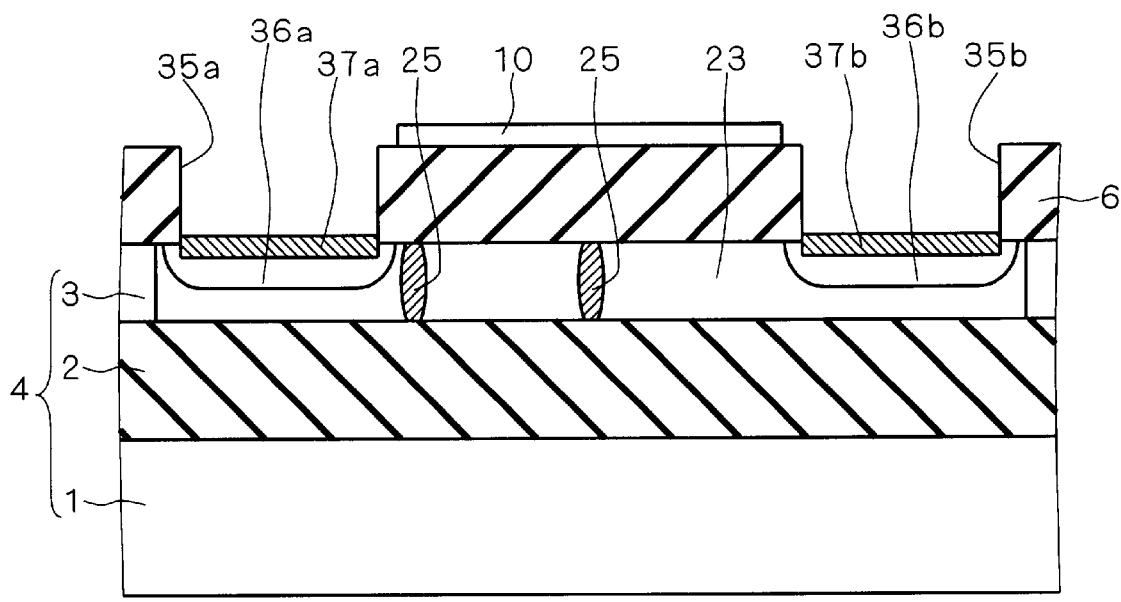
FIG. 33 is a sectional view showing a structure of a second semiconductor device for evaluation according to the seventh preferred embodiment of the present invention.

FIG. 33 is a sectional view showing a structure of a second semiconductor device for evaluation according to the seventh preferred embodiment. The SOI layer 3 has the ion implantation region 23 formed in the evaluation region therein. Further, the silicide regions 25 are formed in the evaluation region of the SOI layer 3 consequently upon generation of the crystal defects 24 within the SOI layer 3 due to the formation of the ion implantation region 23. The second semiconductor device for evaluation according to the seventh preferred embodiment can be manufactured by employing the same method of manufacturing the semiconductor device for evaluation according to the sixth preferred embodiment except that the ion implantation region 23 is formed prior to the step of forming the silicon oxide film 6 (FIG. 27).

Figure 34:
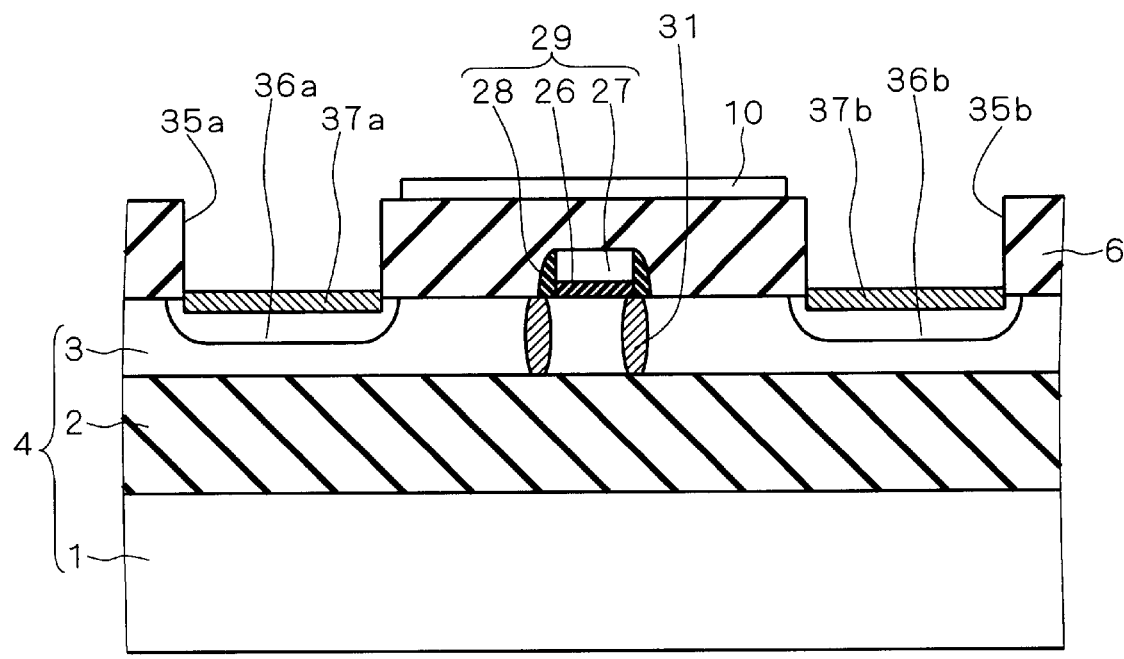
FIG. 34 is a sectional view showing a structure of a third semiconductor device for evaluation according to the seventh preferred embodiment of the present invention.

FIG. 34 is a sectional view showing a structure of a third semiconductor device for evaluation according to the seventh preferred embodiment. The SOI layer 3 has the gate structure 29 formed on the evaluation region therein. Further, the silicide regions 31 are formed in the evaluation region of the SOI layer 3 consequently upon generation of the crystal defects 30 within the SOI layer 3 due to the formation of the gate structure 29. The third semiconductor device for evaluation according to the seventh preferred embodiment can be manufactured by employing the same method of manufacturing the semiconductor device for evaluation according to the sixth preferred embodiment except that the gate structure 29 is formed prior to the step of forming the silicon oxide film 6 (FIG. 27).

Figure 35:
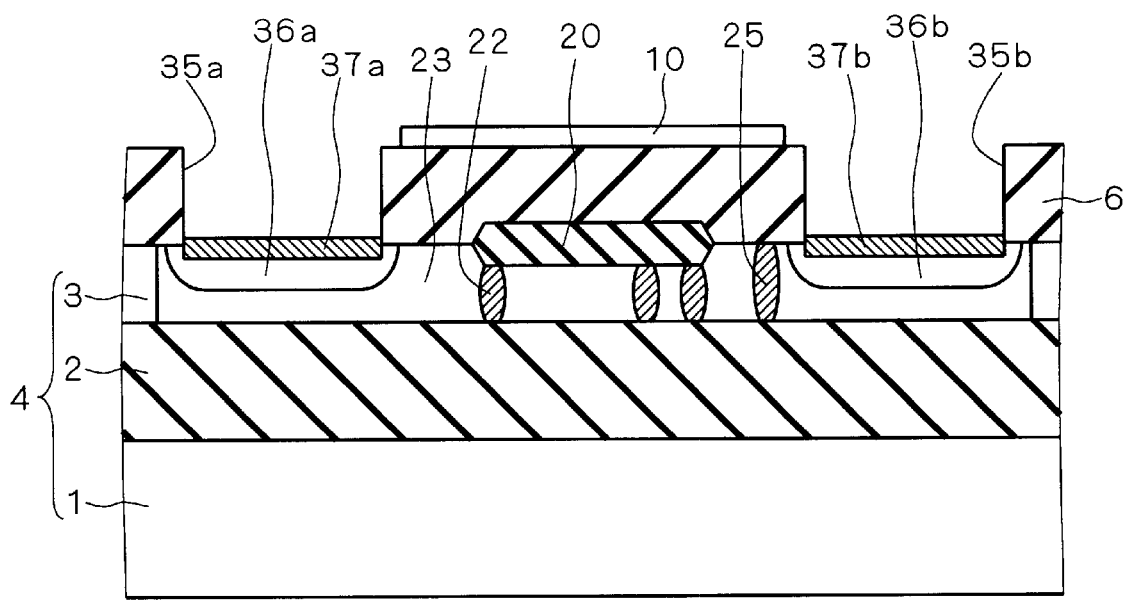
FIG. 35 is a sectional view showing a structure of a fourth semiconductor device for evaluation according to the seventh preferred embodiment of the present invention.

FIG. 35 is a sectional view showing a structure of a fourth semiconductor device for evaluation according to the seventh preferred embodiment. The SOI layer 3 has the isolation insulating film 20 and the ion implantation region 23 formed in the evaluation region therein. Further, the silicide regions 22 and 25 are formed in the evaluation region of the SOI layer 3 consequently upon generation of the crystal defects 21 and 24, respectively, which are generated within the SOI layer 3 due to the formation of the isolation insulating film 20 and the ion implantation region 23, respectively. The fourth semiconductor device for evaluation according to the seventh preferred embodiment can be manufactured by employing the same method of manufacturing the semiconductor device for evaluation according to the sixth preferred embodiment except that the isolation insulating film 20 and the ion implantation region 23 are formed prior to the step of forming the silicon oxide film 6 (FIG. 27).

Figure 36:
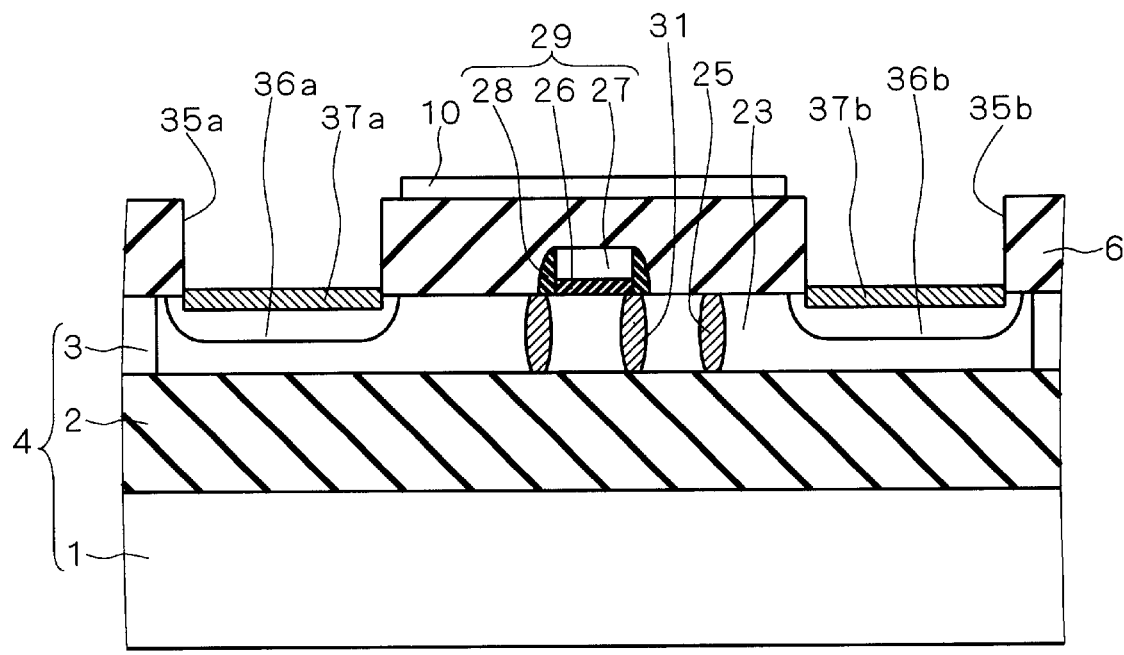
FIG. 36 is a sectional view showing a structure of a fifth semiconductor device for evaluation according to the seventh preferred embodiment of the present invention.

FIG. 36 is a sectional view showing a structure of a fifth semiconductor device for evaluation according to the seventh preferred embodiment. The SOI layer 3 has the gate structure 29 formed on the evaluation region therein, and further has the ion implantation region 23 formed in the evaluation region therein. Moreover, the silicide regions 25 and 31 are formed in the evaluation region of the SOI layer 3 consequently upon generation of the crystal defects 24 and 30, respectively, which are generated within the SOI layer 3 due to the formation of the ion implantation region 23 and the gate structure 29, respectively. The fifth semiconductor device for evaluation according to the seventh preferred embodiment can be manufactured by employing the same method of manufacturing the semiconductor device for evaluation according to the sixth preferred embodiment except that the ion implantation region 23 and the gate structure 29 are formed prior to the step of forming the silicon oxide film 6 (FIG. 27).

As described above, the semiconductor devices for evaluation according to the seventh preferred embodiment allow the crystal defects generated in the SOI layer 3 due to a manufacturing process for a semiconductor device to be evaluated using an in-line test which employs an OBIC technique while avoiding performing a destructive test which is required in a preferential etching process included in the conventional evaluation method.

Additionally, in the first through seventh preferred embodiments described above, the metal film 7, 9 or the transition layer 10, 12 is formed on the silicon oxide film 6, to be used as a source of metals supplied to the SOI layer 3. However, in the present invention, the metal film 7, 9 or the transition layer 10, 12 may not necessarily be formed. In such a case, metals contained in a metal film which is formed during the silicidation on a top face of the gate electrode or a source/drain region are gettered by crystal defects in the SOI layer 3, resulting in formation of silicide regions due to generation of the crystal defects. Accordingly, an off-line test which is carried out by picking up a wafer for evaluation from a lot of wafers may be performed after the silicidation on the gate electrode or the source/drain region, in the present invention. The foregoing procedure is effective for improving yield.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device for evaluation comprising the steps of:
    (a) preparing a substrate having a semiconductor layer which contains a crystal defect to be evaluated;
    (b) forming an insulating film on at least an evaluation region of said semiconductor layer;
    (c) forming a metal-containing film containing a metal on said insulating film; and
    (d) causing said metal contained in said metal-containing film to pass through said insulating film and diffuse into said semiconductor layer by carrying out a heat treatment, to detect said crystal defect.

2. The method according to claim 1, further comprising the step of (e) after said step (d), removing said metal-containing film and said insulating film located on said evaluation region, together with said crystal defect detected by said step (d).

3. The method according to claim 1, further comprising the step of (e) after said step (d), exposing said semiconductor layer by partially removing said insulating film, to form first and second recesses on opposite sides of said evaluation region.

4. The method according to claim 1, further comprising the steps of:
    (e) after said step (d), forming first and second contact plugs on opposite sides of said evaluation region, said first and second contact plugs being connected to said semiconductor layer; and
    (f) forming first and second interconnects connected to said first and second contact plugs, respectively.

5. The method according to claim 1, wherein said step (c) has the steps of:
    (c-1) applying a solution to which said metal is added to said insulating film; and
    (c-2) drying said solution.

6. The method according to claim 1, wherein said step (c) has the step of (c-1) depositing a metal film on said insulating film.

7. The method according to claim 1, wherein said step (c) has the steps of:
    (c-1) forming a metal film on said insulating film;
    (c-2) causing a metal contained in said metal film to diffuse into said insulating film by carrying out a heat treatment, to form a transition layer in an interface between said metal film and said insulating film; and
    (c-3) after said step (c-2), removing said metal film.

8. The method according to claim 1, wherein in said step (c), said metal-containing film is formed only above said evaluation region.

9. The method according to claim 1, further comprising the step of (e) between said steps (a) and (b), performing a predetermined semiconductor manufacturing process on said evaluation region.

10. The method according to claim 9, wherein said step (e) has at least one of the steps of:
    (e-1) forming an isolation insulating film in said evaluation region; and
    (e-2) forming an ion implantation region in said evaluation region.

11. The method according to claim 9, wherein said step (e) has at least one of the steps of:
    (e-1) forming a gate structure on said evaluation region; and
    (e-2) forming an ion implantation region in said evaluation region.

* * * * *